United States Patent
Lifshitz et al.

(10) Patent No.: US 8,784,685 B2
(45) Date of Patent: Jul. 22, 2014

(54) CORE-ALLOYED SHELL SEMICONDUCTOR NANOCRYSTALS

(75) Inventors: Efrat Lifshitz, Haifa (IL); Ariel Kigel, Haifa (IL); Maya Brumer-Gilary, Nesher (IL); Aldona Sashchiuk, Nazareth-Illit (IL); Lilac Amirav, Hod Hasharon (IL); Viktoria Kloper, Haifa (IL); Dima Cheskis, Nesher (IL); Ruth Osovsky, Rehovot (IL)

(73) Assignee: Technion Research and Development Foundation Ltd., Haifa (IL)

( * ) Notice: Subject to any disclaimer, the term of this patent is extended or adjusted under 35 U.S.C. 154(b) by 556 days.

(21) Appl. No.: 12/780,404

(22) Filed: May 14, 2010

(65) Prior Publication Data

US 2011/0006285 A1 Jan. 13, 2011

Related U.S. Application Data

(63) Continuation-in-part of application No. 11/662,272, filed as application No. PCT/IL2005/000952 on Sep. 8, 2005.

(60) Provisional application No. 60/608,108, filed on Sep. 9, 2004.

(51) Int. Cl.
*C09K 11/08* (2006.01)
*C09K 11/56* (2006.01)
*B05D 7/00* (2006.01)

(52) U.S. Cl.
USPC .................. 252/301.4 S; 427/212

(58) Field of Classification Search
USPC ................... 252/301.4 S; 427/212
See application file for complete search history.

(56) References Cited

U.S. PATENT DOCUMENTS

| | | | |
|---|---|---|---|
| 6,251,303 B1 | 6/2001 | Bawendi et al. | |
| 6,322,901 B1 | 11/2001 | Bawendi et al. | |
| 6,576,291 B2 | 6/2003 | Bawendi et al. | |
| 6,607,829 B1 | 8/2003 | Bawendi et al. | |
| 6,815,064 B2* | 11/2004 | Treadway et al. | 428/403 |
| 7,515,333 B1* | 4/2009 | Empedocles | 359/344 |
| 2007/0111324 A1* | 5/2007 | Nie et al. | 436/518 |
| 2010/0289003 A1* | 11/2010 | Kahen et al. | 257/14 |

FOREIGN PATENT DOCUMENTS

WO 2004049522 A2 6/2004

OTHER PUBLICATIONS

Bailey. Alloyed Semiconductor Quantum Dots: Tuning the Optical Properties without Changing the Particle Size. J. Am. Chem. Soc. 2003, 125, 7100-7106.*
Sirota et al.,"IV-VI Semiconductor Nanocrystals for Passive Q-Switch in IR," Proc. of SPIE, 2004, pp. 9-16, vol. 5510.

(Continued)

*Primary Examiner* — Matthew E Hoban
(74) *Attorney, Agent, or Firm* — Browdy and Neimark, PLLC

(57) ABSTRACT

The invention relates to a core-alloyed shell semiconductor nanocrystal comprising: (i) a core of a semiconductor material having a selected band gap energy; (ii) a core-overcoating shell consisting of one or more layers comprised of an alloy of the said semiconductor of (i) and a second semiconductor; (iii) and an outer organic ligand layer, provided that the core semiconductor material is not HgTe. In certain embodiments, the core semiconductor material is PbSe and the alloy shell semiconductor material has the $PbSe_xS_{1-x}$ structure; or the core semiconductor material is CdTe and the alloy shell semiconductor material has either the $CdTe_xSe_{1-x}$ or $CdTe_xS_{1-x}$ structure.

14 Claims, 5 Drawing Sheets

(56) References Cited

OTHER PUBLICATIONS

Osovsky et al.,"Continuous-Wave Pumping of Multiexciton Bands in the Photoluminescence Spectrum of a Single CdTe—CdSe Core-Shell Colloidal Quantum Dot," Physical Review Letters, 2009, pp. 197401-1-197401-4, vol. 102, No. 19.

Bang J.H. et al; "Quantum Dot Sensitized Solar Cells. A Tale of Two Semiconductor Nanocrystals: CdSe and CdTe" ACS Nano 3(6), pp. 1467-1476 (2009).

Beard M.C. et al; "Multiple Exciton Generation in Colloidal Silicon Nanocrystals" Nano Letters 7 No. 8, pp. 2506-2512 (2007).

Brumer M.et al; "PbSe/PbS and PbSe/PbSexS1—x Core/Shell Nanocrystals" Advanced Functional Materials vol. 15, Issue 7, pp. 1111-1116. (2005).

Brus L.E., J.; "Electron—electron and electronhole interactions in small semiconductor crystallites: The size dependence of the lowest excited electronic state" The Journal of Chemical Physics 80, pp. 4403-4409 (1984).

Chamarro M. et al; "Enhancement of electron-hole exchange interaction in CdSe nanocrystals: A quantum confinement effect" Physical Review B vol. 53 No. 3, pp. 1336-1342. (1996).

Choudhury K.R. et al; "Hybrid Quantum-Dot—Polymer Nanocomposites for Infrared Photorefractivity at an Optical Communication Wavelength" Advanced Materials vol. 15 No. 5, pp. 2877-2881. (2005).

Dabbousi B.O. et al; "(CdSe)ZnS Core-Shell Quantum Dots: Synthesis and Characterization of a Size Series of Highly Luminescent Nanocrystallites" The Journal of physical chemistry B 101, pp. 9463-9475. (1997).

Dekel E. et al; "Carrier-carrier correlations in an optically excited single semiconductor quantum dot" Physical Review B vol. 61 No. 16, pp. 11009-11020. (2000).

DiVincenzo D.P "Quantum Computation" Science vol. 270 No. 5234, pp. 255-261. (1995).

Dorfs D. et al; "Type-I and Type-II Nanoscale Heterostructures Based on CdTe Nanocrystals: A Comparative Study" Small, vol. 4, Issue 8, pp. 1148-1152. (2008).

Dubertret B; "The use of quantum dots as DNA nanosensors promises to signifi cantly enhance the sensitivity of fluorescencebased DNA detection for medical diagnosis and biomolecular investigations". Nature Materials 4, pp. 797-798. (2005).

Efros Al.L. et al; "Interband absorption of light in a semiconductor sphere" Soviet Physics Semiconductors 16, pp. 772-775. (1982).

Efros A.L. et al; "Band-edge exciton in quantum dots of semiconductors with a degenerate valence band: Dark and bright exciton states" Physical Review B vol. 54 No. 7, pp. 4843-4856. (1996).

Efros A.L. et al; "Random Telegraph Signal in the Photoluminescence Intensity of a Single Quantum Dot" Physical Review Letters vol. 78 No. 6, pp. 1110-1113. (1997).

Empedocles S.A. et al; "Three-dimensional orientation measurements of symmetric single chromophores using polarizationmicroscopy" Letters to nature vol. 399, pp. 126-130. (1999).

Fradkin L. et al; "Magneto-optical studies of HgTe/HgxCd1-xTe(S) core-shell nanocrystals" Chemphyschem 4, pp. 1203-1210. (2003).

Franceschetti A. et al; "Optical transitions in charged CdSe quantum dots" Physical Review B, vol. 62, No. 24. pp. R16 287-R16 290. (2003).

Gunes S et al; "Hybrid solar cells using PbS nanoparticles", Solar Energy Materials & Solar 91, pp. 420-423. (2007).

Harbold J.M. et al; "Time-resolved intraband relaxation of strongly confined electrons and holes in colloidal PbSe nanocrystals" Physical Review B 72, pp. 195312-1-195312-6. (2005).

Kim S. et al; "Type-II Quantum Dots: CdTe/CdSe(Core/Shell) and CdSe/ZnTe(Core/Shell) Heterostructures" Journal of the American Chemical Society 125, pp. 11466-14467. (2003).

Klimov V.I. et al; "Optical Gain and Stimulated Emission in Nanocrystal Quantum Dots". Science vol. 290, pp. 314-317. (2000).

Klimov V.I.et al; Quantization of Multiparticle Auger Rates in Semiconductor Quantum Dots Science vol. 287, pp. 1011-1013. (2000).

Klimov V.I. et al; "Single-exciton optical gain in semiconductor nanocrystals" Nature 447, pp. 441-446.(2007).

Kroner M. et al; "Optical Detection of Single-Electron Spin Resonance in a Quantum Dot" Physical Review Letters 100, pp. 156803-1-156803-4. (2008).

Li I.et al; "Highly Luminescent CuInS2/ZnS Core/Shell Nanocrystals: Cadmium-Free Quantum Dots for In Vivo Imaging" Chemistry of Materials 21, pp. 2422-2429 (2009).

Lifshitz E. et al; "Air-Stable PbSe/PbS and PbSe/PbSexS1-x Core-Shell Nanocrystal Quantum Dots and Their Applications" The Journal of physical chemistry B 10, pp. 25356-24365. (2006).

Lifshitz E. et al; "Synthesis and Characterization of PbSe Quantum Wires, Multipods, Quantum Rods, and Cubes" Nano Letters 3, pp. 857-862. (2003).

Loss D. et al; "Quantum computation with quantum dots" Physical Review A vol. 57 No. 1, pp. 120-126. (1998).

Ma W. et al; "Photovoltaic Devices Employing Ternary PbSxSe1-x Nanocrystals" Nano Letters vol. 9 No. 4, pp. 1699-1703. (2009).

Mcguire J.A. et al; "New Aspects of Carrier Multiplication in Semiconductor Nanocrystals Accounts of Chemical" Research vol. 41 No. 12, pp. 1810-1819. (2008).

Mews A et al; "Preparation, characterization, and photophysics of the quantum dot quantum well system cadmium sulfide/mercury sulfide/cadmium sulfide" The Journal of physical chemistry 98, pp. 934-941. (1994).

Micic O.I.et al; "Core-Shell Quantum Dots of Lattice-Matched ZnCdSe2 Shells on InP Cores: Experiment and Theory" The Journal of physical chemistry. B 104, pp. 12149 -12156. (2000).

Millo o. et al; "Tunneling and Optical Spectroscopy of InAs and InAs/ZnSe Core/Shell Nanocrystalline Quantum Dots". physica status solidi B vol. 224 No. 1. pp. 271-276. (2001).

Murayama K. et al; "Anti-Stokes luminescence tail in porous Si", Solid State Communications 117, pp. 419-422. (2001).

Murphy J.E. et al; Time-Resolved Photoconductivity of PbSe Nanocrystal Arrays The Journal of physical chemistry. B 110, pp. 25455 -25461. (2006).

Murray C.B. et al; "Colloidal synthesis of nanocrystals and nanocrystal superlattices" IBM journal of research and development, vol. 45, No. 1, pp. 47-56. (2001).

Nair G. et al; "Carrier multiplication yields of CdSe and CdTe nanocrystals by transient photoluminescence spectroscopy" Physical Review B 76, pp. 081304-1-081304-4. (2007).

Neuhauser R.G. et al; "Correlation between Fluorescence Intermittency and Spectral Diffusion in Single Semiconductor Quantum" Physical Review Letters, vol. 85 No. 15, pp. 3301-3304. (2000).

Nozik A.J. "Quantum dot solar cells" Physica E 14 , pp. 115-120. (2002).

Nozik A.J."Multiple exciton generation in semiconductor quantum dots" Chemical Physics Letters 457, pp. 3-11, (2008).

Oron D. et al; "Multiexcitons in type-II colloidal semiconductor quantum dots" Physical Review B 75, pp. 035330-1-035330-7, (2007).

Pakovich Y.P. et al; "Anti-Stokes Photoluminescence in II—VI Colloidal Nanocrystals" physica status solidi (b) 229 No. 1, pp. 449-452, (2002).

Peng X.G. et al; "Epitaxial Growth of Highly Luminescent CdSe/CdS Core/Shell Nanocrystals with Photostability and Electronic Accessibility" Journal of the American Chemical Society 119, pp. 7019-7029. (1997).

Piryatinski A. et al; "Effect of Quantum and Dielectric Confinement on the Exciton-Exciton Interaction Energy in Type II Core/Shell Semiconductor Nanocrystals" Nano Letters vol. 7. No. 1, pp. 108-115. (2007).

Reiss P. et al; "Highly Luminescent CdSe/ZnSe Core/Shell Nanocrystals of Low Size Dispersion" Nano Letters vol. 2. No. 7, pp. 781-784. (2002).

Santoni A. et al; "Band structure of lead sulphide" Journal of Physics: Condensed Matter 4, pp. 6759-6768. (1992).

Sashchiuk A. et al; "PbSe Nanocrystal Assemblies: Synthesis and Structural, Optical, and Electrical Characterization" Nano Letters vol. 4. No. 1, pp. 159-165. (2004).

(56) References Cited

OTHER PUBLICATIONS

Sashchiuk A. et al; "Synthesis and characterization of PbSe and PbSe/PbS core—shell colloidal nanocrystals" Journal of Crystal Growth 240, pp. 431-438. (2002).

Shumway J. et al; "Correlation versus mean-field contributions to excitons, multiexcitons, and charging energies in semiconductor quantum dots" Physical Review B, vol. 63, pp. 155316-1-155316-13. (2001).

Smith A.M., et al; "Tuning the optical and electronic properties of colloidal nanocrystals by lattice strain" Nature nanotechnology vol. 4, pp. 56-63. (2009).

Somers R.C. et al; "CdSe nanocrystal based chem-/bio-sensors" Chemical Society Reviews 36, pp. 579-591. (2007).

Spanhel L. et al; "Photochemistry of Colloidal Semiconductors. 20. Surface Modification and Stability of Strong Luminescing CdS Particles" Journal of the American Chemical Society 109, pp. 5649-5655 (1987).

Steckel J.S. et al; "Blue Luminescence from (CdS)ZnS Core—Shell Nanocrystals" Angewandte Chemie International Edition 43, pp. 2154-2158. (2004).

Talapin D.V., et al; "Highly Luminescent Monodisperse CdSe and CdSe/ZnS Nanocrystals Synthesized in a Hexadecylamine-Trioctylphosphine Oxide-Trioctylphospine Mixture" Nano Letters, vol. 1 No. 4, pp. 207-211. (2001).

Thomas N. L. et al; "Multiline spectra of single Cd Se Zn S core-shell nanorods" Applied Physics Letters 89, pp. 263115-1-163115-3. (2006).

Trinh M.T. et al; "In Spite of Recent Doubts Carrier Multiplication Does Occur in PbSe Nanocrystals" Nano Letters, vol. 8 No. 6, pp. 1713-1718. (2008).

Wei S.H. et al; "Electronic and structural anomalies in lead chalcogenides" Physical Review B vol. 55 No. 20, pp. 13605-13609. (1997).

Yu W.W. et al; "Preparation and Characterization of Monodisperse PbSe Semiconductor Nanocrystals in a Noncoordinating Solvent" Chemistry of materials 16, pp. 3318-3322. (2004).

* cited by examiner

CORE-ALLOYED SHELL SEMICONDUCTOR NANOCRYSTALS

CROSS-REFERENCE TO RELATED APPLICATIONS

The present application is a continuation-in-part application of U.S. patent application Ser. No. 11/662,272, filed Oct. 31, 2007, which is a 371 national stage application of PCT/IL2005/000952, filed Sep. 8, 2005, and claims the benefit of U.S. Provisional Patent Application No. 60/608,108, filed Sep. 9, 2004, the entire contents of each and all these applications being herewith incorporated by reference in their entirety as if fully disclosed herein.

FIELD OF THE INVENTION

The present invention relates to semiconductor nanocrystals and, in particular, to such nanocrystals comprising a semiconductor core surrounded by a shell of a semiconductor alloy and an outer organic ligand layer.

Abbreviations: CdO: Cadium oxide; CQD(s): Colloidal quantum dot(s); EDAX: energy dispersion analytical X-ray; FWHM: full width at half maximum; HR-TEM: high resolution TEM; ML: monolayer(s); NC(s): nanocrystal(s); OA: oleic acid; ODE: octadecene; Pb-ac: lead (II) acetate trihydrate; PhEt: phenyl ether; PL: photoluminescence; PMMA: polymethylmethacrylate; SAED: selected area electron diffraction; SAQD(s): self assembled quantum dots; TEM: transmission electron microscopy; TOP: trioctylphosphine.

BACKGROUND OF THE INVENTION

Semiconductor nanocrystals (NCs) have attracted worldwide scientific and technological interest due to their size-tunable electronic properties (Efros and Efros, 1982; Brus, 1984). These materials are prepared by colloidal procedures, involving surface capping by organic ligands, demonstrating exquisite control of the crystalline quality, size, shape and composition, and the formation of hetero-structures (Spanhel et al., 1987; Peng et al., 1997; Mews et al., 1994; Dabbousi et al., 1997), offering unique flexibility in the design and operation of nano-scaled devices. Efforts to synthesize NCs and in particular colloidal quantum dots (CQDs) thereof, were followed by numerous investigations of the optical and electrical properties of these materials, including exchange interaction, single excitons fine structure (Efros et al., 1996; Franceschetti and Zunger, 2000; Chamarro et al., 1996), stimulated emission (Klimov et al., 2000; Choudhury et al., 2005; Lifshitz et al., 2006), multiple excitons generation (Harbold et al., 2005; Beard et al., 2007; Nair and Bawendi, 2007; Nozik, 2008; Trinh et al., 2008), charge injection (Shumway et al., 2001), Auger relaxation (Efros and Rosen, 1996; Klimov et al., 2000), and photoconductivity (Murphy et al., 2006). These phenomena can be a groundwork for the development of NCs-based gain devices (Klimov et al., 2000; Lifshitz et al., 2006), photovoltaic cells (Nozik, 2002; Gunes et al., 2007; Ma et al., 2009; Bang and Kamat, 2009), quantum information light sources (DiVincenzo, 1995), spintronics (Loss and DiVincenzo, 1998; Atatüre et al., 2006) and biological labelling (Dubertret, 2005; Somers et al., 2007). However, they maybe limited by undesired relaxation effects; multiple excitons within CQDs' cores are "squeezed" into a volume comparable to a single bulk exciton, when these cores are surrounded by molecules with low dielectric constant. These conditions induce exciton-exciton attractive Coulomb interactions, which enhance the so-called Auger process (a nonradiative relaxation), leading to a fast quenching (<100 ps) of the multiple excitons' emission (Harbold et al., 2005; Thomas et al., 2006; Beard et al., 2007; Nair and Bawendi, 2007; Mcguire et al., 2008; Nozik, 2008), and to a photoluminescence spectra diffusion and intensity fluctuations (blinking) (Efros and Rosen, 1997; Empedocles et al., 1999). Then, multiple excitons become undetectable in time-integrated experiments, inaccessible for population inversion in gain devices, and avoid multiple carriers' generation in photovoltaic cells. Further on, single exciton, multiple and charged excitons lifetime can be influenced by the existence of surface traps. It is significant to mention that long-lived (~0.5 ns) multiple excitons do exist in analogous self-assembled quantum dots (SAQDs), which are strained on a semiconductor wetting layer as well as covered by a semiconductor cladding layer (Dekel et al., 2000; Kroner et al., 2008). The differences between the two-quantum dot systems might be related to the dots' volume, dielectric screening of the surrounding, charge neutralization, and carriers' delocalization. This information suggests that persistence of multiple excitons in CQDs will be extended to a timeframe of ~ns by the suppression of the Auger effect, and it may take place in colloidal hetero-structures, namely core/shell CQDs, and if engineered appropriately, can resemble the SAQDs, without losing the flexibility and applicability inherent in their synthesis.

The IV-VI (e.g., PbSe, PbS) NCs, and in particular the CQDs, are a focus of special interest due to their unique intrinsic properties (Santoni et al., 1992). Bulk PbSe and PbS materials have a cubic (rock salt) crystal structure and a narrow direct band gap (0.28-0.41 eV at 300 K) at the L point of the Brillouin zone. The high dielectric constant ($\epsilon_\infty$=18.0-24.0) and the small electron and hole effective mass (<0.1 m*) create an exciton with a relatively large effective Bohr radius ($a_{B(PbSe)}$=46 nm), eight times larger than that of CdSe. New inter-band optical studies of colloidal PbSe NCs exhibit well-defined band-edge excitonic transitions tuning between 1.0-0.5 eV, and small Stokes shift. In a similar manner, the II-VI NCs and particularly the CQDs are also of a special interest, due to their optical tunnability between the visible and near infrared spectral regime, (with bulk band gap of 1.475 eV, $\epsilon_\infty$=7.4-9.3, $a_{B(CdTe)}$=7.3 nm), and chemical flexibility at the CQDs' surface.

Various colloidal syntheses have been developed in the last two decades. These colloidal procedures varied mainly by the use of surfactants with different molecular lengths and attraction forces to the NCs surface. Alternatively, core-shell structures consisting of NCs covered by an epitaxial layer of another wide-band semiconductor were formed. Semiconductor nanocrystals that include a core of one or more first semiconductor materials, which may be surrounded by a shell of a second semiconductor material, and are optionally surrounded by a coat of an organic capping agent are disclosed in several US patents granted to Bawendi et al. See, for example, U.S. Pat. Nos. 6,774,361, 6,696,299, 6,617,583, 6,607,829, 6,602,671, 6,576,291, 6,501,091, 6,444,143, 6,426,513, 6,326,144, 6,322,901, 6,319,426, 6,251,303 and 6,207,229, all these patents being hereby incorporated by reference in their entirety as if fully disclosed herein. In U.S. Pat. No. 6,602,671, for example, many semiconductors are mentioned in the description and preferable materials for the core are ZnO, ZnS, ZnSe, ZnTe, CdS, CdO, CdSe, CdTe, MgS, MgSe, GaAs, GaN, GaP, GaSb, GaSb, HgO, HgS, HgSe, HgTe, InAs, InN, InP, InSb, AlAs, AlN, AlP, and AlSb, but the examples show specifically semiconductor nanocrystals in which the core is CdSe and the shell is ZnS.

Fradkin et al. (2003) reported the synthesis and magneto-optical properties of HgTe nanocrystals capped with HgxCd1−xTe(s) alloyed shells.

SUMMARY OF THE INVENTION

The present invention relates to a core-alloyed shell semiconductor nanocrystal comprising: (i) a core of a semiconductor material having a selected band gap energy; (ii) a core-overcoating shell consisting of one or more layers of an alloy of said semiconductor of (i) and a second semiconductor; (iii) and an outer organic ligand layer, provided that the core semiconductor material is not HgTe.

In certain embodiments, the semiconductor core material is a lead chalcogenide, preferably PbSe, and the semiconductor alloy is composed of said lead chalcogenide and another chalcogen such as S or Te. Preferably, the alloy is $PbSe_xS_{1-x}$.

In other embodiments, the semiconductor core material is a cadmium chalcogenide, preferably CdTe, and the semiconductor alloy is composed of said cadmium chalcogenide and another chalcogen such as Se or S. Preferably, the alloy is $CdTe_xSe_{1-x}$ or $CdTe_xS_{1-x}$.

DETAILED DESCRIPTION OF THE INVENTION

Figure 1:
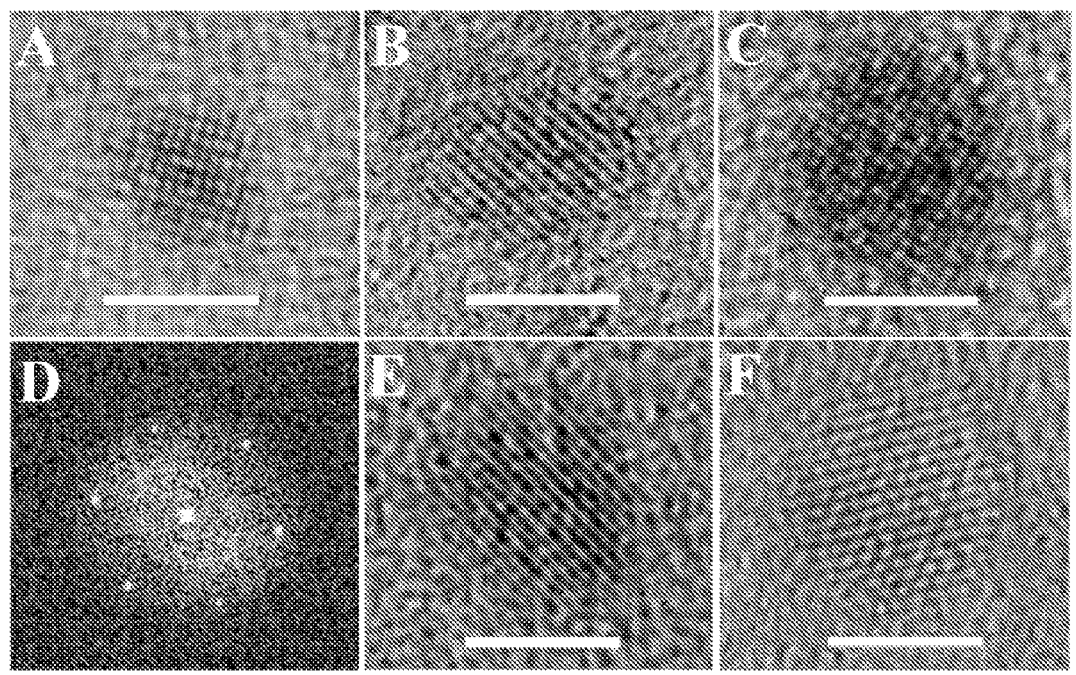
FIG. 1 (panels A-F) depicts HR-TEM images (Bar scale=5.0 nm) of: a 4.8 nm core PbSe NC (A); a 6.1 nm PbSe/PbS core-shell NC with 4.8 nm core (B); a 6.1 nm $PbSe/PbSe_xS_{1-x}$ core-alloyed shell NC with Pb:Se:S molar ratio similar to the sample in panel B (C); Fast Fourier transform of the image in panel B (D); a 7.3 nm PbSe/PbS core-shell NC with 4.8 nm core (E); and a 7.5 nm $PbSe/PbSe_xS_{1-x}$ core-alloyed shell NC with Pb:Se:S molar ratio similar to the sample in panel C (F). A two-injection process was used in panels B and E, and the single-injection single-pot synthesis was used in panels C and F.

In one aspect, the present invention provides a core-alloyed shell semiconductor nanocrystal comprising: (i) a core of a semiconductor material having a selected band gap energy; (ii) a core-overcoating shell consisting of one or more layers comprised of an alloy of said semiconductor of (i) and a second semiconductor; (iii) and an outer organic ligand layer, provided that the core semiconductor material is not HgTe.

As used herein, "a core-alloyed shell semiconductor nanocrystal" includes, for example, inorganic crystallites between about 3 nm and about 100 nm in diameter, preferably between about 3 nm and about 50 nm, more preferably between about 3 nm to about 20 nm, still more preferably between about 3 nm to about 10 nm, that comprises a core of a first semiconductor material which is surrounded by a shell of a semiconductor material that is an alloy composed of the core first semiconductor material and a second semiconductor material.

The nanocrystals of the present invention may be in the form of dots (i.e., spheres), rods, wires or multipods, but they are preferably in the form of dots, termed herein as either nanocrystal quantum dots (NQDs) or colloidal quantum dots (CQDs).

Examples for semiconductor core and/or alloy shell materials include, without being limited to, those of the group II-VI (ZnS, ZnSe, ZnTe, CdS, CdSe, CdTe, HgS, HgSe, MgTe) and III-V (GaN, GaP, GaAs, GaSb, InN, InP, InAs, InSb, AlAs (vis), AlP (uv), AlSb (vis), AlN (uv)) and IV-VI (PbS, PbSe, PbTe) materials. In certain embodiments, the semiconductor core material is a lead chalcogenide, preferably PbSe, and the semiconductor alloy is composed of said lead chalcogenide and another chalcogen such as S or Te, preferably, $PbSe_xS_{1-x}$. In other embodiments, the semiconductor core material is a cadmium chalcogenide, preferably CdTe, and the semiconductor alloy is composed of said cadmium chalcogenide and another chalcogen such as Se or S, preferably $CdTe_xSe_{1-x}$ or $CdTe_xS_{1-x}$.

The core semiconductor material is selected according to its band gap energy. The selection of the semiconductor material composing the core is made according to the desired application, which requires a specific band gap.

Thus, in one embodiment, the band gap energy of the core semiconductor material is in the infrared, including the vis/near infrared, energy range. Examples of such semiconductor materials are PbS, PbSe, PbTe, CdTe, InN, InP, InAs, InSb, HgS, HgSe, or GaSb. In one particular embodiment of the invention, the core semiconductor material is PbSe. In another particular embodiment, the core semiconductor material is CdTe, the band gap energy of which is in the vis/near infrared energy range.

In another embodiment, the band gap energy of the core semiconductor material is in the visible energy range. Examples of such semiconductor materials are CdSe, CdTe, ZnSe, ZnTe, AlAs, AlP, AlSb, AlN, GaP or GaAs. In one particular embodiment of the invention, the core semiconductor material is CdTe.

In a further embodiment, the band gap energy of the core semiconductor material is in the ultraviolet energy range. An example of such semiconductor material is GaN and ZnS.

The shell material surrounding the core is a semiconductor alloy material composed of the core semiconductor material and a second semiconductor material.

As with respect to core/shell CQDs, the radial distribution of the electron and hole wavefunctions across the core/alloy shell interface depends on the mutual alignment of the core and alloy shell band-edge offset, as well as on the discontinuity in the effective masses and the dielectric constants of the constituents. The final electronic structure varies due to a change in the core-diameter/alloy shell-thickness ratio and the constituents' composition. The electronic structure can thus be adjusted from a Type-I alignment, in which the valence and conduction band-edges of the alloy shell wrap that of the core, to Type-II alignment, in which band-edges of the constituents have a staggered configuration. While Type-I alignment mainly localizes the carriers within the core, Type-II alignment permits a separation between electron and hole wavefunctions, when the electron (hole) remains in the core and the opposite carrier diffuses to the shell. Intermediate alignment, named quasi-Type-II, is characterized by a localization of one carrier in the core, and delocalization of the counter carrier over the entire core-alloy shell hetero-structure.

In one embodiment, representing a Type-I alignment of the electronic structure, the alloy shell material thus has a bandgap greater than the core bandgap and can be used as an optically capping to the core for an improved quantum yield. In another embodiment, representing a Type-II alignment of the electronic structure, in which the band-edges of the constituents have a staggered configuration, the alloy shell material has a bandgap similar or larger than the core bandgap and can thus be used for the cases where the alloyed shell is in the focus of interest.

The atomic spacing of the alloy shell should be close to that of the core material in order to prevent crystallographic mismatch that would result in the formation of carriers trapping sites. However, the gradual change of the alloy shell atomic spacing should relax the stick demand and offer the ability to use a variety of semiconductors for the alloyed shell, including combinations of core/shell that were not seen previously. The atomic spacing should be identical to that of the core material or differ from it by up to 7%. The crystallographic structure should be identical to that of the core material.

In one embodiment, the present invention provides a core-alloyed shell semiconductor nanocrystal, wherein the core has the structure of AB or AC; the semiconductor shell comprises an alloy of the $AB_xC_{1-x}$ structure, wherein A is selected from the group consisting of Cd, Zn, Hg, In, Ga, and Pb; B and C are selected from the group consisting of N, P, As, S, Se and Te; x is the mole fraction of B and 1−x is the mole fraction of C, with x gradually changing within a range wherein x<1 and x>0. In one particular embodiment, A is Pb, B is Se and C is S, and the invention provides a core-alloyed shell semiconductor nanocrystal wherein the core semiconductor material is PbSe and the alloy shell semiconductor material has the $PbSe_xS_{1-x}$ structure. In another particular embodiment, A is Cd, B is Te and C is Se, and the invention provides a core-alloyed shell semiconductor nanocrystal wherein the core semiconductor material is CdTe and the alloy shell semiconductor material has the $CdTe_xSe_{1-x}$ structure.

In another embodiment, the present invention provides a core-alloyed shell semiconductor nanocrystal wherein the core has the structure of DF or EF; the semiconductor shell comprises an alloy of the $D_xE_{1-x}F$ structure, wherein D and E are selected from the group consisting of Cd, Zn, Hg, In, Ga, and Pb; F is selected from the group consisting of N, P, As, S, Se and Te; x is the mole fraction of D and 1−x is the mole fraction of E, with x gradually changing within a range wherein x<1 and x>0, but excluding the core-alloyed shell semiconductor nanocrystal wherein the core has the structure of HgTe and the semiconductor shell comprises an alloy of the $Hg_xCd_{1-x}Te$ structure. In one embodiment, D is Cd, E is Zn and F is S and the invention provides a core-alloyed shell semiconductor nanocrystal wherein the core semiconductor material is CdS and the alloy shell semiconductor material has the $Cd_xZn_{1-x}S$ structure.

The core-alloyed shell semiconductor nanocrystals of the invention are further capped by an outer organic ligand layer. The organic capping agent may be selected from a large number of materials, but it should have an affinity for the semiconductor nanocrystal surface. In general, the capping agent can be an isolated or conjugated, i.e., conducting, organic molecule, a polymer (or a monomer for a polymerization reaction), or an inorganic complex. The coat may be used to convey solubility, e.g., the ability to disperse a coated semiconductor nanocrystal homogeneously into a chosen solvent, functionality, binding properties, or the like. In addition, the coat can be used to tailor the optical properties of the semiconductor nanocrystal. The organic ligand layer may be an organic molecule having groups that bind to the nanocrystal surface layer. If the nanocrystals are used for identification purposes, the organic molecule will also have groups that bind to substances or materials.

Stabilization agents must be present during the nanocrystals growth to prevent aggregation and precipitation of the nanocrystals. When the stabilizing molecules are attached to the nanocrystal surface as a monolayer though covalent, dative (coordination), or ionic bonds, they are referred to as capping groups or ligands. These ligands serve to mediate nanocrystal growth, sterically stabilize nanocrystals in solution, and passivate surface electronic states. Synthetic organic techniques allow the tail and head groups to be independently tailored through well-established chemical substitutions. Examples of such organic ligands include, without being limited to, alkyl amines and ammonium salts thereof; aryl amines and ammonium salts thereof; alkyl phosphonium salts; aryl phosphonium salts; alkyl organic acids and salts thereof; aryl organic acids and salts thereof; aliphatic alcohols; aryl alcohols; alkylphosphines, alkylphosphine oxides, arylphosphines, arylphosphine oxides, diamines, thiols, thioamines, thio-carboxylates and pyridine. In certain embodiments of the invention, the organic ligand is a trialkylphosphine such as trioctylphosphine (TOP), or oleic acid (OA). It should be noted that some of these organic ligands, particularly amines, alcohols and carboxyls, may further serve as templating molecules for the growth of anisotropic shapes (viz, wires, rods, polypods), when their functional groups are preferably bound to certain surface crystallographic facets, avoiding a growth onto it, however, permitting a unidirectional growth at the remained exposed facets.

The semiconductor nanocrystals of the invention are prepared in a coordinating solvent, such as TOP and/or OA, resulting in the formation of a passivating organic layer on the nanocrystal surface comprised of the organic solvent. The passivated semiconductor nanocrystals are readily soluble/dispersible in organic solvents, such as toluene, chloroform and hexane. In addition, the functional moieties of the capping agent may be readily displaced or modified to provide an outer coating that renders the semiconductor nanocrystals suitable for several uses.

In one embodiment, the alloyed shell of the semiconductor nanocrystal exhibits gradual change of the crystallographic lattice spacing from the crystallographic lattice spacing of the core to that of the most outer layer. The shell is a ternary alloy and as such its semiconducting and structural properties, such as the lattice parameter, the energy gap, etc., can be varied in a controlled fashion by varying the composition. The composition of the alloy can be of a ternary alloy as defined above, i.e., $AB_xC_{1-x}$ or $D_xE_{1-x}F$, with x gradually changing within a range wherein x<1 and x>0. Thus, for example, in the case of the alloyed shell $PbSe_xS_{1-x}$, the composition and hence the material properties will gradually change from those of PbSe to those of PbS. The composition change follows along the nanocrystal radius, R, where the alloyed shell composition is similar to that of the core for the lower values of R and x decreases from one to its minimum value, preferably zero, as R increases. The crystallographic lattice spacing gradual change prevents interface defects between the core and the shell. Such defects can serve as trap sites for charge carriers and damage the nanocrystal luminescence.

In another embodiment, the alloyed shell of the semiconductor nanocrystal exhibits gradual change of the dielectric constant, thus improving the quantum yield for luminescence, by decreasing the probability of competing, non-radiative events associated with the trapping of carriers (electrons or holes) in an abrupt core-shell interface.

The selection of the composition as well as the size of the semiconductor nanocrystal affects the characteristic spectral emission wavelength of the semiconductor nanocrystal. Thus, a particular composition of a semiconductor nanocrystal as described above will be selected based upon the spectral region being monitored. For example, semiconductor nanocrystals that emit energy in the visible range include, but are not limited to CdS, CdSe, CdTe, ZnSe, ZnTe, GaP, and GaAs. Semiconductor nanocrystals that emit energy in the near IR range include, but are not limited to, InP, InAs, InSb, PbS, and PbSe. Finally, semiconductor nanocrystals that emit energy in the blue to near ultraviolet include, but are not limited to CdS, ZnS and GaN. For any particular composition selected for the semiconductor nanocrystals of the invention, it is possible to tune the emission to a desired wavelength by controlling the size of the particular composition of the semiconductor nanocrystal. In preferred embodiments, monodispersed nanocrystals are required because of the strong influence of the nanocrystals size on their properties. In particular, preparation of monodispersed samples enables systematic control of the structural, electronic, and optical properties of the semiconductors core-alloyed shell nanocrystals. As used herein, the term "monodispersed nanocrystals" means a colloidal system in which the suspended particles have substantially identical size and shape with standard deviations of less than 10% root-mean-square (rms) in diameter, and preferably less than 5%. Further narrowing of the sample monodispersity can be done by optical means, through selective excitation of only a fraction of the sample. The more preferable standard deviation of 5% corresponds to ±one lattice constant throughout the 1-15 nm size range.

In certain embodiments, the core-alloyed shell semiconductor nanocrystals of the invention exhibit photoluminescence having quantum yields within the range of 20% to 100%, preferably greater than 40-50%, more preferably greater than 60-70%, most preferably equal to or greater than 80%.

Nanocrystalline materials can be tailored by a judicious control of particle composition, size and surface. This can be achieved by a number of chemical strategies, e.g., fast injection of precursors in coordinating solvents.

The present invention further provides a single-pot colloidal synthesis for the preparation of a core-alloyed shell semiconductor nanocrystals according to the invention, wherein said synthesis may be either a single- or double-injection process, depending on the reactivity of the core precursors compared with the reactivity of each one of said precursors with the shell anionic precursor.

In one embodiment, the single-pot colloidal synthesis of the invention is a single-injection process, comprising simultaneous injection of stoichiometric amounts of the core and shell semiconductor precursors into a solution comprised of organic ligands as defined above or in which said organic ligands are dissolved, at elevated temperatures, under inert conditions, whereby a fast nucleation of the core semiconductor material occurs, followed by a deposition of the semiconductor shell material with a gradual composition.

In another embodiment, the single-pot colloidal synthesis of the invention is a double-injection process, comprising (i) injection of stoichiometric amounts of the core semiconductor precursors into a solution comprised of organic ligands as defined above or in which said organic ligands are dissolved, at elevated temperatures, under inert conditions, whereby a fast nucleation of the core semiconductor material occurs; (ii) terminating the core semiconductor material growth by reduction of the temperature; and (iii) injection of a stoichiometric amount of the shell anionic precursor into said solution, at elevated temperatures, under inert conditions, whereby deposition of the semiconductor shell material with a gradual composition occurs.

For example, for the preparation of nanocrystals according to the invention wherein the core semiconductor material is PbSe and the alloy shell semiconductor material is $PbSe_xS_{1-x}$, a single-injection process is required, since the faster release of Se from its precursor (TOP:Se) and consequently the faster reactivity of Pb with Se precursors, in comparison with the release of S from its precursor (TOP:S) (Weast, 1980), leads to a faster nucleation of PbSe core, followed by the formation of a shell containing PbS, as long as the stoichiometric ratio between the Se and S precursors is kept, i.e., the amount of the Se precursor is higher than that of the S precursor. On the other hand, for the preparation of nanocrystals wherein the core semiconductor material is CdTe and the alloy shell semiconductor material is $CdTe_xSe_{1-x}$, a double-injection process is required, in view of the similar reactivity of Cd with Se and Te precursors, at a selected temperature. In both cases described hereinabove, a fast reaction of the core material precursors occurs leading to a fast nucleation of the core material, followed by deposition of the shell alloy with a gradual composition. The single-pot colloidal synthesis of the invention requires less human involvement, and results in an improved control over shape, composition, size, size-distribution and purification of the nanocrystals, while maintaining a gradual change of the monomer, i.e., semiconductor constituents, concentrations.

The terms "core semiconductor precursor" and "core precursor", used herein interchangeably, and the terms "shell semiconductor precursor" and "shell precursor" used herein interchangeably, refer to precursors of the elements constituting the core and the alloy-shell semiconductor materials, respectively, i.e., compositions of said elements capable of being dissolved in a solution comprised of organic ligands as defined above or in which said organic ligands are dissolved, while continuously releasing ions of said elements to the solution. Non-limiting examples of such precursors include those used for the preparation of the semiconductor nanocrystals exemplified in the Examples section hereinafter, i.e., Pb(OA)$_2$, Cd(OA)$_2$, TOP:Se, TOP:Te and TOP:S.

The Examples hereinafter show the preparation of nanocrystals according to the invention wherein the semiconductor material of the core is AB or AC, the semiconductor shell comprises an alloy of the AB$_x$C$_{1-x}$ structure, wherein A is selected from Cd, Zn, Hg, In, Ga, or Pb, B and C are selected from N, P, As, S, Se, or Te, x is the mole fraction of B, and 1−x is the mole fraction of C, with x gradually changing within a range wherein x<1 and x>0, utilizing either the single- or double-injection single-pot synthesis described above. In case the single-injection process is carried out, in particular for the preparation of PbSe/PbSe$_x$S$_{1-x}$ NCs exemplified in Example 3, precursors of AB and AC (i.e., of PbSe and PbS) are dissolved in a solution of an organic solvent and surfactant, and are then simultaneously injected into the pot at high temperature, quenching to room temperature and isolating the nanocrystals. Alternatively, in case the double-injection process is carried out, in particular for the preparation of CdTe/CdTe$_x$Se$_{1-x}$ NCs exemplified in Example 9, precursors of AB and AC (i.e., of CdTe and CdSe) are dissolved in a solution of an organic solvent and surfactant, wherein the precursors required for the formation of the core structure (either AB or AC) are first injected into the pot at high temperature, and following reduction of the temperature, terminating the core semiconductor material growth, a precursor of the shell anionic constituent is injected into the pot, forming the shell alloy with a gradual composition.

In one particular embodiment, the preparation of PbSe/PbSe$_x$S$_{1-x}$ core-alloyed shell nanocrystals of the invention is carried out by injecting a mixture of: (i) the precursor lead acetate trihydrate, or lead oxide, dissolved in a solution of phenyl ether (PhEt), OA and TOP, and (ii) a chalcogen precursor mixture of Se and S dissolved in TOP, into a pre-heated PhEt solution, terminating the nanocrystals growth by quenching to room temperature, and isolating the nanocrystals.

In another particular embodiment, the preparation of CdTe/CdTe$_x$Se$_{1-x}$ core-alloyed shell nanocrystals of the invention is carried out by injecting a mixture of: (i) the precursor cadmium oxide dissolved in a solution of OA, ODE and TOP, and (ii) a chalcogen precursor of Te dissolved in TOP, into a pre-heated ODE solution; terminating the core semiconductor material growth by reduction of the temperature; injection of a chalcogen precursor of Se dissolved in TOP into said solution; terminating the nanocrystals growth by quenching to room temperature; and isolating the nanocrystals.

The present invention thus particularly provides a distinctive technique for the growth of PbSe/PbSe$_x$S$_{1-x}$ and CdTe/CdTe$_x$Se$_{1-x}$ core-alloyed shell NCs by single-injection of Pb, Se and S precursors, or alternatively, double-injection of Cd, Te and Se precursors, into a pre-heated organic ligand-containing solution in a single-pot. The properties of PbSe/PbSe$_x$S$_{1-x}$ and CdTe/CdTe$_x$Se$_{1-x}$ core-alloyed shell NCs, prepared in the single-pot synthesis of the invention, were compared with those of PbSe/PbS and CdTe/CdSe core-shell NCs, prepared within two pots via two separate injections, using the same precursors and surfactants. As described in detail hereinafter, the single-pot synthesis of the invention permits the generation of core-alloyed shell structures, when the fast nucleation of PbSe or CdTe component creates the core constituent, followed by precipitation of PbSe$_x$S$_{1-x}$ or CdTe$_x$Se$_{1-x}$ alloyed shell, with ~1-5% crystalline mismatch.

As shown hereinafter, the single-pot colloidal procedure of the invention provides high quality lead-chalcogenide core-alloyed shell nanocrystals, wherein the constituents, PbSe and PbS, semiconductors, show a similar crystallographic cubic structure with a 1.3% crystallographic mismatch, suitable for the formation of highly ordered core-shell structures. While comparing the influence of the shell composition on the structural and optical properties of (a) core PbSe NCs capped with organic ligands prepared as exemplified in Example 1; (b) PbSe/PbS core-shell NCs prepared by an exchange of the organic ligands with the PbS shell as exemplified in Example 2; and (c) PbSe/PbSe$_x$S$_{1-x}$ core-alloyed shell NCs prepared by the single-pot colloidal synthesis of the invention as exemplified in Example 3, it has been found that the single-pot process permits a fast nucleation of a PbSe core, pursued by a slower precipitation of a PbS or PbSe$_x$S$_{1-x}$ alloyed shell. As further found, the single-pot procedure generated NCs with 5% size distribution and a luminescence quantum efficiency of 65%, while PbSe/PbS core-shell NCs prepared as described in Example 2 had 8% size distribution and a luminescence quantum efficiency of 40%.

As further shown, the single-pot colloidal procedure of the invention provides high quality cadmium-chalcogenide core-alloyed shell nanocrystals, wherein the constituents, CdTe and CdSe, semiconductors, show a similar crystallographic cubic structure with a ~6% crystallographic mismatch, suitable for the formation of highly ordered core-shell structures. While comparing the influence of the shell composition on the structural and optical properties of (a) core CdTe NCs capped with organic ligands prepared as exemplified in Example 8; and (b) CdTe/CdTe$_x$Se$_{1-x}$ core-shell NCs prepared by insertion of epitaxial inorganic shell beneath the organic ligands as exemplified in Example 9, it has been found that the single-pot process permits a nucleation of a high quality CdTe core, pursued by addition of a controlled CdTe$_x$Se$_{1-x}$ alloyed shell. As further found, the single-pot procedure generated NCs with 5% size distribution and a luminescence quantum efficiency of 90%.

Although the single-pot colloidal synthesis of the invention has been developed for the preparation of core-alloyed shell semiconductor nanocrystals, it should be understood that this procedure may further be used for the preparation of core/alloyed-shell/shell nanocrystal configuration as well, depending on the stoichiometric ratio of the two anionic constituents of the shell available in the solution while deposition of the semiconductor shell material occurs. In other words, in cases one of the anionic constituents of the shell is totally consumed before terminating the shell deposition, one or more layers of an exterior shell semiconductor material consisting of the cationic constituent and the anionic constituent left in the solution are formed, overcoating the alloyed shell. The number of exterior shell layers formed during that phase depends, inter alia, on the amount of the anionic constituent left in the solution and the duration of that phase of the process. It should be noted that in cases an exterior shell is formed, overcoating the alloyed shell, the outer organic ligand layer of the nanocrystals of the invention covers, in fact, the exterior shell of the nanocrystals.

Thus, in certain embodiments of the invention, semiconductor nanocrystals having, e.g., the structures AB/AB$_x$C$_{1-x}$/AB, AB/AB$_x$C$_{1-x}$/AC, AC/AB$_x$C$_{1-x}$/AB and AC/AB$_x$C$_{1-x}$/AC wherein A, B, C and x are as defined above, are formed. Particular non-limiting examples of semiconductor nanocrystals of the invention having such structures include PbSe/PbSe$_x$S$_{1-x}$/PbSe, PbSe/PbSe$_x$S$_{1-x}$/PbS, PbS/PbSe$_x$S$_{1-x}$/PbSe, PbS/PbSe$_x$C$_{1-x}$/PbS, CdTe/CdTe$_x$Se$_{1-x}$/PbTe, CdTe/CdTe$_x$Se$_{1-x}$/PbSe, CdSe/CdSe$_x$Te$_{1-x}$/CdSe and CdSe/CdSe$_x$Te$_{1-x}$/CdTe.

The present invention further provides a nanocrystal array of the core-alloyed shell semiconductor nanocrystals of the invention, in ordered or disordered packing, with close proximity of said nanocrystals, reserving the properties of individual nanocrystals and creating new collective effects. The characteristics of such a nanocrystal array will depend on the array structure (symmetry, the distance between the nanocrystals, the organic ligands used, etc.) and on the nanocrystals that comprise the array.

In certain embodiments, the nanocrystal array of the core-alloyed shell semiconductor nanocrystals of the invention comprises core-alloyed shell semiconductor nanocrystals wherein the semiconductor core material is a lead chalcogenide, preferably PbSe, and the semiconductor alloy is composed of said lead chalcogenide and another chalcogen such as S or Te, preferably, PbSe$_x$S$_{1-x}$. In other embodiments, the nanocrystal array of the invention comprises core-alloyed shell semiconductor nanocrystals wherein the semiconductor core material is a cadmium chalcogenide, preferably CdTe, and the semiconductor alloy is composed of said cadmium chalcogenide and another chalcogen such as Se or S, preferably CdTe$_x$Se$_{1-x}$ or CdTe$_x$S$_{1-x}$.

The semiconductor nanocrystals of the invention, i.e., both the core/alloy-shell as well as the core/alloy-shell/shell NCDs, having "barrier-less" structures, reduce the lattice stain, crystallographic defects and dielectric mismatch at the core/shell interface thus permitting a smooth carrier' delocalization, that is, reduces the attractive Coulomb forces and the Auger quenching.

The semiconductor nanocrystals and nanocrystal arrays of the invention may be useful for many applications, such as light-emitting diodes, photovoltaic cells, lasers, photonic band-gap crystals, ultra fast photonic switches and biomedical tags for fluoroassays, nanosensors and biological imaging. Thus, for example, the core-alloyed shell semiconductor nanocrystals of the invention can be incorporated in a passive Q-switch device, they may be useful in telecommunication, eye-safe lasers in the IR and low power lasers, light emitting diodes, photovoltaic cells and as biological markers. For use as biological markers, the NCs of the invention should have a very specific suitable type of organic layers (bio-compatible) as organic capping according to the biological material to be examined. The appealing aspect of the core-alloyed shell nanocrystals of the invention for the biological markers application resides in their excellent photoluminescence quantum yield.

The invention will now be illustrated by the following non-limiting Examples.

EXAMPLES

Instrumentation

TEM studies, combined with EDAX and SAED, were carried out on a JEOL 2000FX instrument, operated at 200 kV. HR-TEM images were recorded with a JEOL 3010 instrument operated at 300 kV. The TEM specimens were prepared by injecting small liquid droplets of the solution on a cooper grid (300 mesh) coated with amorphous carbon film and then drying at room temperature. The absorbance spectra were recorded using a UV-VIS-NIR spectrometer JASCO V-570. The PL spectra were obtained by exciting the samples with a Ti:Sapphire laser, while emission was recorded using an Acton monochromator equipped with a cooled Ge detector. All measurements were carried out at room temperature.

Example 1

Synthesis of PbSe NCs Cores, Covered with Organic Surfactants

The synthesis of core PbSe NCs followed a modified procedure similar to that described by Murray et al. (2001) and Yu et al. (2004), including the preceding stages:

1.1 0.71 gr of lead (II) acetate trihydrate (Pb-ac) [Pb(CH$_3$COO)$_2$.3H$_2$O, GR, Merck] were dissolved in a solution composed of 2 ml PhEt (C$_6$H$_5$OC$_6$H$_5$, 99%, Aldrich), 1.5 ml OA (CH$_3$(CH$_2$)$_7$CHCH(CH$_2$)$_7$COOH, 99.8%, Aldrich) and 8 ml TOP ((C$_8$H$_{17}$)$_3$P, Tech, Aldrich), under standard inert conditions in the glove box, and were inserted into a three-neck flask (flask I);

1.2 10 ml of PhEt were inserted into a three-neck flask (flask II) under the inert conditions of a glove box;

1.3 Both flasks were taken out of the glove box, were placed on a Schlenk line and heated under a vacuum to 100-120° C. for an hour;

1.4 Flask I was cooled to 45° C., while flask II was heated to 180-210° C., both under a fledging of an argon-gas;

1.5 0.155 gr of selenium powder (Se, 99.995%, Aldrich) was dissolved in 2.0 ml TOP, forming a TOP:Se solution, under standard inert conditions of a glove box. Then, 1.7 ml of this solution was injected into flask I on the Schlenk line;

1.6 The content of flask I, containing the reaction precursors, was injected rapidly into the PhEt solution in flask II, reducing its temperature to 100-130° C., leading to the formation of PbSe NCs within the first 15 minutes of the reaction.

The above procedure produced nearly monodispersed NCs with <8% size distribution, with average size between 3-9 nm, controlled by the temperature and by the time duration of the reaction.

Example 2

Synthesis of PbSe/PbS Core-Shell NCs by a Two-Pots Two-Injection Process

The preparation of PbSe/PbS core-shell NCs by a two-injection process begins with formation of core PbSe NCs and their isolation from the initial reaction solution, according to the procedure described in Example 1 above. The core NCs were re-dissolved in chloroform solution, forming a solution of 50 mg/ml weight concentration. 1.4 ml of TOP was then added to the NCs solution, while the chloroform molecules were removed by distillation under vacuum and heating at 60° C. In parallel, 0.2 gr of a Pb precursor, Pb-ac, was dissolved in a mixture of 2 ml PhEt, 1.5 ml of OA, and 8 ml of TOP, heated to 120° C. for an hour, and then cooled to 45° C. Also, 0.03-0.10 gr of sulfur (S, 99.99+%, Aldrich) was dissolved in 0.3 ml of TOP and was premixed with a PbSe core NCs in a TOP solution. This mixture was injected into the Pb-ac solution. All reagents were then injected into a PhEt mother solution and kept on a Schlenk line at 180° C., causing a reduction in temperature of the mother solution to 120° C. The indicated chemical portions caused the precipitation of 1-3 monolayers of PbS shell over the PbSe core surface within the first 15 minutes of the reaction.

Example 3

Synthesis of PbSe/PbSe$_x$S$_{1-x}$ Core-Alloyed Shell NCs by a Single-Injection Single-Pot Process The preparation of PbSe/PbSe$_x$S$_{1-x}$ core-alloyed shell structures was nearly identical to that of the core PbSe NCs, described in Example 1, using a single injection of the precursors into a single round flask. However, step 1.5 was altered by the use of an alternative chalcogen precursor solution. A stock solution of Se and S was prepared by mixing 0.15 gr Se dissolved in 1.4 ml TOP, with 0.03-0.10 gr S dissolved in 0.3 ml TOP. The amount of S in the new stock solution corresponded to a stoichiometric amount of 1-3 monolayers of the PbS compound. Thus, the mole ratio of the precursors Pb:Se:S ranged from 1:1:0.5 to 1:1:1.3.

Example 4

Purification and Examination of the NCs

Aliquots were drawn periodically from the round flask, and the NCs growth was terminated by a quenching process to room temperature. The NCs were isolated from the aliquots solution by the addition of methanol, and by centrifugation, and the isolated NCs were further purified by dissolving them in chloroform, followed by filtering with 0.02 micron membrane for several times. The purified NCs were examined by structural analyses, absorption and PL spectroscopy.

The colloidal NCs were embedded in a polymer film or dissolved in a glassy solution (2,2,4,4,6,8,8-heptamethyl-nonane) for the optical measurements. The polymer was prepared by mixing PbSe NCs in chloroform solution with polymethylmethacrylate (PMMA) [—CH$_2$C(CH$_3$)(CO$_2$CH$_3$)—]$_n$, analytical grade, Aldrich) polymer solution. The resultant mixture was spread on a quartz substrate and dried to a uniform film over 24 hours.

Example 5

Comparison of the Structural Properties of the Various NC Samples

We compared the influence of the shell composition on the structural properties of the following samples: (a) Core PbSe NCs capped with organic ligands; (b) PbSe/PbS core-shell NCs, prepared by a conventional two-injection process; (c) PbSe/PbSe$_x$S$_{1-x}$ core-alloyed shell NCs, prepared by the single-injection single-pot synthesis described in Example 3. The indicated syntheses utilized Pb, Se and/or S precursors in OA/TOP/PhEt as a stock solution that was injected into a pre-heated PhEt mother solution, in either a single-injection or a two-injection process. The single-injection process generated NCs of a 5% size distribution, while the core synthesis and the core-shell synthesis by a two-injection process created NCs of a 8% size distribution.

The structural properties of the NCs samples, prepared by a single-injection of Pb, Se, and S precursors (Example 3) were compared with those generated by a two-injection process (Example 2) and with those of the core PbSe NCs, using similar precursors and surfactants (Example 1). The results are shown in FIG. 1 (panels A-F). Panel A shows the HR-TEM image of core PbSe NCs with a 4.8 nm diameter. HR-TEM images of the corresponding PbSe/PbS core-shell NCs, prepared by the two-injection process described in Example 2 are shown in panels B and E. The specific images revealed the formation of spherical NCs with a high crystallinity, without a distinct boundary at the core-shell interface, but with an increase in the NCs size by 1.2 nm (panel B) or 2.4 nm (panel E), consistent with a PbS shell thickness of one and two monolayers (ML). Fast Fourier transform, analogous to a selected area electron diffraction (SAED), of a sample similar to that shown in panel B is represented in panel D. This confirms the existence of rock salt crystallographic structures for PbSe and PbS without the distinction of separate lattice parameters due to their close crystallographic matching. HR-TEM images of NCs samples, prepared by the single-injection single-pot synthesis described in Example 3 with stoichiometric amounts equivalent to the samples shown in panels B and E, are presented in panels C and F, respectively. The comparison of these images demonstrates an identical core-shell NCs' diameter when prepared by the single-injection or two-injection processes. In addition, the energy dispersive analysis of electron diffraction (EDAX) measurements confirmed the existence of the Pb, Se and S constituents at the indicated core-alloyed shell samples. Thus, these experiments suggest that a single-injection of Pb, Se and S precursors results in the generation of core-alloyed shell structures with crystallography, size and composition similar to the equivalent NCs prepared by a two-injection process. The faster reactivity of Pb with Se precursors, in comparison with the reaction with the S precursors (Weast, 1980), leads to a faster nucleation of a PbSe core, followed by the formation of a shell containing the PbS reagent, as long as the stoichiometric ratio between the Se and S precursors is kept, i.e., the amount of the Se precursor is higher than that of the S precursor.

Example 6

Comparison of the Optical Properties of the Various NC Samples

Figure 2:
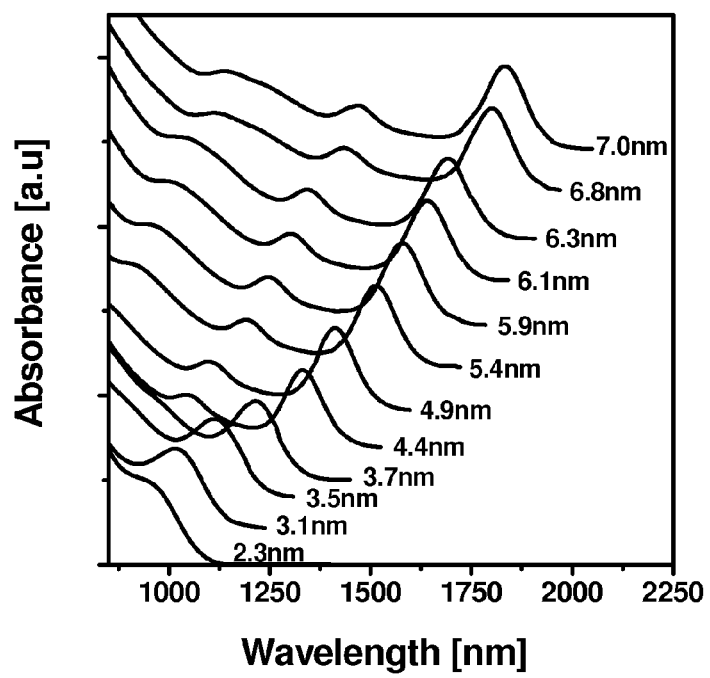
FIG. 2 is a graph showing the absorption spectra of core PbSe NCs (capped with OA and TOP surfactants) with various core diameters.

We then compared the influence of the shell composition on the optical properties of the samples (a), (b) and (c) described in Example 5. The optical properties of the samples further clarified the nature of the core-shell NCs formed by the single-injection single-pot process. The absorption spectra of core PbSe NCs with various diameters (2.3 nm, 3.1 nm, 3.5 nm, 3.7 nm, 4.4 nm, 4.9 nm, 5.4 nm, 5.9 nm, 6.1 nm, 6.3 nm, 6.8 nm, and 7.0 nm), with a measured quantum efficiency of 40%, are shown in FIG. 2. These samples showed an energy blue shift with a decrease in the NCs size, tunable in the near IR spectral regime. As indicated in the Background of the Invention section above, a cubic rock salt PbSe semiconductor exhibits direct band transitions at the L point of the Brillouin zone with a four-fold degeneracy. Ignoring this degeneracy, the allowed transitions obey the $\Delta j=0, \pm 1$ and $\pi_e \pi_h = -1$ selection rules, when j and π designate the total angular momentum and parity of the electronic state. According to these rules, the lowest absorption band corresponds to the $j=\frac{1}{2}, \pi=1 \rightarrow j=\frac{1}{2}, \pi=-1$ transition (indicated herein as 1S-exciton); and the third lowest absorption band corresponds to the $j=\frac{1}{2}$ or $\frac{3}{2}, \pi=-1 \rightarrow j=\frac{1}{2}$ or $\frac{3}{2}, \pi=1$ transition. The parity-forbidden transition $j=\frac{1}{2}, \pi=1 \rightarrow j=\frac{1}{2}, \frac{3}{2}, \pi=1$ or $j=\frac{1}{2}$ or $\frac{3}{2}, \pi=-1 \rightarrow j=\frac{1}{2}, \pi=-1$ is partially allowed due to a mixing of the degenerate states in the valence band, and those are responsible for the second lowest absorption band.

Figure 3:
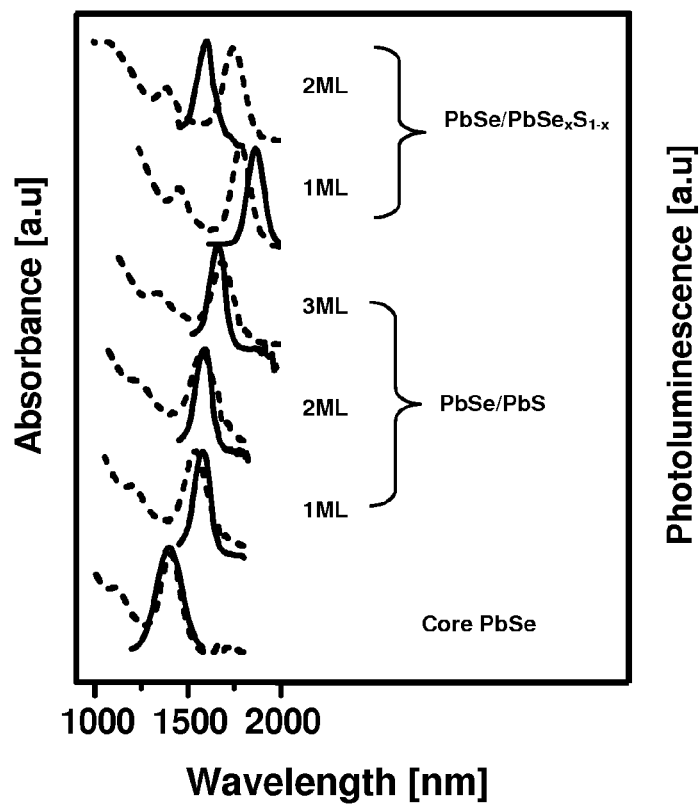
FIG. 3 is a graph showing absorbance (dashed lines) and PL (solid lines) spectra, recorded at room temperature, of core PbSe NCs (bottom curves); PbSe/PbS core-shell NCs with nML (n=1, 2, 3) shell thickness, prepared by a two-injection process (three middle curves); and $PbSe/PbSe_xS_{1-x}$ core-alloyed shell NCs with Pb:Se:S molar ratio similar to the PbSe/PbS core-shell (with nML) NCs, prepared by the single-injection single-pot synthesis (two top curves).

The absorption and photoluminescence (PL) spectra of core PbSe NCs with a diameter of 4.9 nm are shown by the dashed and solid lines, respectively, at the bottom of FIG. 3. The spectra of PbSe/PbS core-shell NCs, prepared by a two-injection process, comprised of a 4.9 nm PbSe core and n-MLs (n=1, 2, 3) of a PbS shell, are presented by the three middle curves in FIG. 3. It is interesting to note that the full width at half maximum (FWHM) of the PbSe/PbS core-shell NCs 1S-emission bands is narrower by a factor ~2 from that of the PbSe core (see Table 1). Moreover, both absorption and PL bands of the PbSe/PbS core-shell NCs samples are red-shifted (up to 152 meV) with an increase of the PbS shell thickness, as summarized in Table 1. This Table also indicates a luminescence Stokes shifts of −8 to 18 meV in the core PbSe and core-shell PbSe/PbS NCs samples. The absorption and PL spectra of the PbSe/PbSe$_x$S$_{1-x}$ core-alloyed shell NCs, prepared by the single-injection single-pot synthesis with stoichiometric amounts equivalent to a 1 ML (named PbSe/PbSe$_x$S$_{1-x}$-1 ML) and 2 ML (named PbSe/PbSe$_x$S$_{1-x}$-2 ML) of PbS shell, are shown at the two top curves in FIG. 3. The spectra of the PbSe/PbSe$_x$S$_{1-x}$-2 ML sample exhibit a peculiar behavior, including a red shift of the absorbance 1S-exciton band with respect to that of the PbSe/PbSe$_x$S$_{1-x}$-1 ML sample; and a large (−44 meV) anti-Stokes shift of the PL band (see Table 1). The spectra of the PbSe/PbSe$_x$S$_{1-x}$-1 ML sample exhibit a similar behavior to that described above for simple PbSe/PbS core-shell samples prepared with a two-injection process (see Table 1). Also, it is important to note that the 1S-exciton of the PbSe/PbSe$_x$S$_{1-x}$-nML (n=1, 2) samples has a quantum efficiency of about 65%, higher compared to that of core PbSe and PbSe/PbS core-shell samples (vide infra).

within the PbSe core. However, an anti-Stokes (negative) shift, which accures in NCs with high S concentration, may be involved with excitation between states with a mixing of $E_V$(PbSe) and $E_V$(PbS), pursued by an emission event between band edge states of the PbSe core only. This anti-Stokes process resembles an energy up-conversion, measured previously in colloidal InP and CdSe NCs capped with organic ligands (Pakovich et al., 2002; Maruyama et al., 2001).

Example 7

Growth Dynamics of Core-Alloyed Shell NCs

Figure 4:
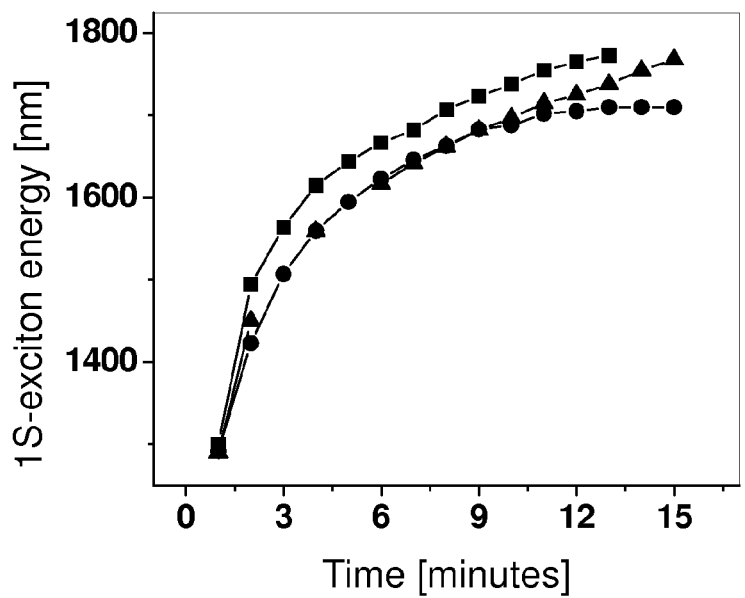
FIG. 4 shows a plot of 1S-exciton absorption energy versus growth time of aliquots of core PbSe NCs (spheres), corresponding core-shell NCs with Pb:S mole ratio equivalent to a 1 ML of PbS (triangles) and core-shell NCs with Pb:S ratio of 2 MLs of PbS (squares). The samples were prepared by the single-injection single-pot synthesis. The solution concentrations of the indicated samples were identical.

The growth dynamics of core-alloyed shell NCs, prepared by the single-injection single-pot synthesis at 120° C., was compared with that of simple core NCs, following the variations in the absorption energy and intensity of aliquots periodically drawn from the reaction solution. A plot of the 1S-exciton energy versus the reaction time is shown in FIG. 4, wherein each point corresponds to the duration of one minute in the reaction time, and the solid lines are drawn only to guide the eye. The spheres represent core NCs showing a gradual increase of the size (or a red shift of the exciton energy) until a plateau is reached after about thirteen minutes,

TABLE 1

Parameters associated with the absorption and PL spectra of the studied NCs

| | Diameter r (nm)[a] | 1S-Exciton Absorption Energy (eV) | 1S-Exciton PL Energy (eV) | Stokes Shift (meV) | Absorption FWHM (meV) | PL FWHM (meV) | $\Delta E_{1S}$ (Abs.) = $E_{core-shell} - E_{core}$ (meV)[b] |
|---|---|---|---|---|---|---|---|
| 1 | 4.8 | 0.890 | 0.882 | 8 | 84 | 99 | |
| 2 | 6.1 | 0.804 | 0.786 | 18 | 80 | 52 | 86 |
| 3 | 7.3 | 0.782 | 0.780 | 2 | 87 | 50 | 106 |
| 4 | — | 0.772 | 0.780 | −8 | 72 | 49 | 152 |
| 5 | 6.1 | 0.696 | 0.667 | 29 | 82 | 40 | |
| 6 | 7.5 | 0.732 | 0.776 | −44 | 55 | 54 | |

1 - PbSe core;
2 - PbSe/PbS 1ML;
3 - PbSe/PbS 2ML;
4 - PbSe/PbS 3ML;
5 - PbSe/PbSe$_x$S$_{1-x}$ 1ML;
6 - PbSe/PbSe$_x$S$_{1-x}$ 2ML
[a]As measured by HR-TEM;
[b]$\Delta E_{1S}$ (Abs.) - Energy difference between the 1S-exciton absorption bands of PbSe/PbS and PbSe core NCs.

The red shift of the absorbance and PL bands in the PbSe/PbS core-shell samples, with respect to that in a reference core PbSe sample (shown in FIG. 3) can be explained by anomalous sequence of the valence and conduction edge energies, when $E_C$(PbS)>$E_C$(PbSe)>$E_V$(PbS)≥$E_V$(PbSe), as reported in bulk IV-VI compounds (Wei et al., 1997). Thus, a spread of the carrier's wave function over $E_V$(PbSe) and $E_V$(PbS) states might occur, red-shifted with respect to the core transitions. Furthermore, an alloyed formation at the core-shell interface would lead to a tunability of the energy difference $\Delta E = E_V$(PbSe)−$E_V$(PbSe$_x$S$_{1-x}$) states, depending on the alloy composition and thickness. A wave function expansion over the core-shell interface was also mentioned in CdSe/ZnS and InP/TOP NCs, with shell potential barrier that is much larger than that of the PbSe/PbS core-shell samples (Dabbousi et al, 1997; Steckel et al., 2004; Neuhauser et al., 2000; Micic et al., 2000; Millo et al., 2001).

A relatively small PL Stokes shift of various cases in FIG. 3 is associated with a zero-phonon-assisted excitation and emission processes, between j=½, π=1→j=½, π=−1 states, when at least one of the precursors was consumed. The triangles in FIG. 4 represent the core-shell NCs, prepared with Pb:Se:S molar ratio appropriate for the formation of PbSe core and 1 ML PbS shell. This figure reveals that a PbSe core is formed during the first eight minutes; however, a band-edge variation occurs beyond this point due to the generation of a core-shell or core-alloyed shell structure. The squares in FIG. 4 represent core-alloyed shell NCs with Pb:S stiochiometric amounts that are equivalent to 2 ML of PbS shell. The 1S-exciton energy of the PbSe/PbSe$_x$S$_{1-x}$-2 ML is red-shifted with respect to the core samples already after the first two minutes, presumably owing to the production of a gradual alloy composition after the initial nucleation of the PbSe core (first point on the graph).

Figure 5:
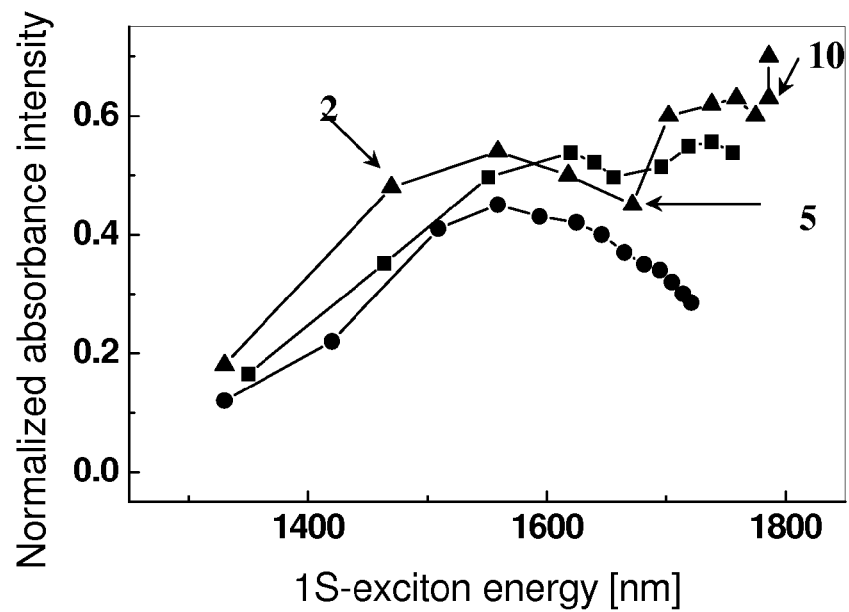
FIG. 5 shows a plot of the normalized absorption intensity versus the 1S-exciton energy of core PbSe NCs (spheres), corresponding core-shell NCs with Pb:S mole ratio equivalent to a 1 ML of PbS (triangles) and core-shell NCs with Pb:S mole ratio equivalent to 2 MLs of PbS (squares). The samples were prepared by the single-injection single-pot synthesis. The solution concentrations of the indicated samples were identical.

FIG. 5 shows plots of the normalized intensity of the 1S-exciton versus its energy for various aliquots with identical NCs concentrations. The dots represent the 1S-exciton intensity of core PbSe NCs, revealing the creation of NCs with the highest quantum efficiency after about four minutes, when each point represent the duration of a minute in the reaction time (see arrows in FIG. 5). The corresponding emission quantum efficiency, as measured by ellipsometer (not shown) was found to be 40%. The triangles represent the variation of the exciton intensity of PbSe/PbSe$_x$S$_{1-x}$ sample with equivalent molar ratio to 1 ML of PbS. This curve reveals a growth parallel to that of simple core NCs, pursued by an abrupt change after about 5 minutes, due to the formation of a shell or alloyed shell.

It is interesting to note that the existence of a shell immediately increased the quantum efficiency of the 1S-exciton to about 65%. The triangles in FIG. 5 indicate that a single-injection process including stoichiometric amounts of 1 ML of PbS shell is initiated by the nucleation of a PbSe core, followed by the deposition of the PbSe$_x$S$_{1-x}$ shell. The squares in FIG. 5 represent the growth dynamics of core-alloyed shell NCs, with Pb:S stoichiometric ratio equivalent to 2 ML of PbS shell. The shift of this curve with respect to the simple core NCs suggests the generation of an alloy composition, already at an early stage of the NCs' growth, referring to the formation of a PbSe/PbSe$_x$S$_{1-x}$/PbS structure.

The influence of the shell composition on the band edge properties can be examined by absorption and photoluminescence spectroscopy, to explore whether the core-alloyed shell structures expose a new possibility in tuning the band gap energy not only by the size of the NCs, but also by the chemical composition and shell thickness, with narrower size distribution (5%) and higher quantum efficiency (65%).

Example 8

Synthesis of CdTe Cores

The synthesis of CdTe NQDs was initiated by the preparation of the precursor solutions under inert conditions in a standard glove box. The Te precursor solution was prepared by dissolving 0.0128-0.0512 gr of Te (0.1-0.4 mmol) in 0.25-1.00 ml TOP until the solution attained a clear yellowish colour. The solution was further diluted with ODE to a total amount of 2.5 ml. The Cd precursor solution was prepared by mixing 0.0256 gr of CdO with 200 μl OA in ODE (10 ml) solution. The Cd solution was heated to 100° C. for 30 minutes under vacuum in a three-neck flask, removing the water content and resulting in the appearance of a homogeneous red mixture. Further on, the system was flushed by dry Ar gas, while the temperature was raised to 300° C., followed by formation of a homogeneous transparent solution and the generation of (Cd(OA)$_2$). Further heating to 310° C., for a period of about 30 minutes, led to the formation of additional a grey-to-black precipitate, which was eventually characterized as crystalline Cd$^0$ NPs (vide infra). The moment the precipitate appears depends on the initial CdO/OA concentration ratio. It should be noted that the concentration of the CdO within the original precursor solution was always the same; however, the concentration of the Te within its precursor solution varied according to the range indicated above. Thus, the influence of the Cd:Te initial molar ratio on the final quality of the product could be investigated (vide infra).

Figure 6:
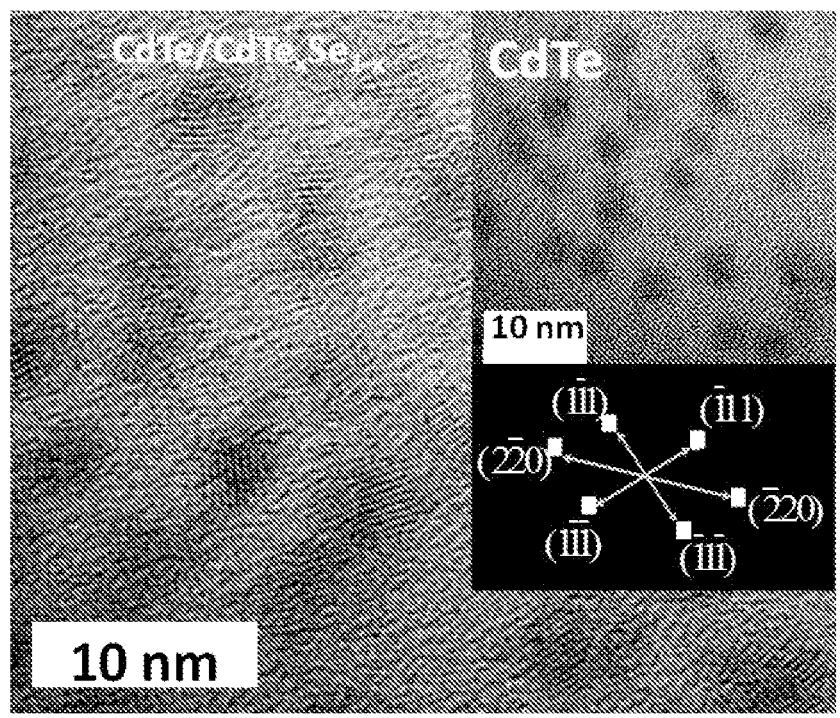
FIG. 6 shows a transmission electron microscope (TEM) image of $CdTe/CdTe_xSe_{1-x}$ core-alloy shell CQDs, with core diameter of 3.0 nm and shell thickness of 1.2 nm. Top inset: TEM image shows the corresponding CdTe cores; and bottom inset shows Fourier transform picture of a single CdTe/Cd-$Te_xSe_{1-x}$, revealing the existence of a zinc-blende crystallographic structure of the core-alloy shell CQD.

The TOP:Te precursor solution was injected into the three-neck flask about 30 seconds after the first appearance of the grey Cd$^0$ NPs precipitate, initiating the nucleation of the CdTe NQDs, followed by an immediate change of the solution color and a temperature drop to 260° C., where further growth of the CdTe NQDs took place. The growth of the NQDs occurred during the first 1-5 minutes with the solution gradually changing its color from yellow to red (FIG. 6). Aliquots of the prepared CdTe NQDs were drawn periodically from the reaction. Cooling the aliquots to room temperature quenched the NQDs growth. These aliquots were then centrifuged in order to precipitate the crystalline Cd$^0$ NPs and separate them from the CdTe NQDs colloidal solution.

The isolation of the CdTe NQDs from the remaining organic solution was performed by the addition of ethanol/acetone mixture and by additional centrifugation. Eventually, the CdTe NQDs were isolated as a clean powder. The separated crystalline Cd$^0$ NPs and the purified CdTe NQDs underwent a series of structural and optical characterization, and for these measurements, the CdTe NQDs had been redissolved in hexane.

Example 9

Synthesis of CdTe/CdTe$_x$Se$_{1-x}$

Figure 7:
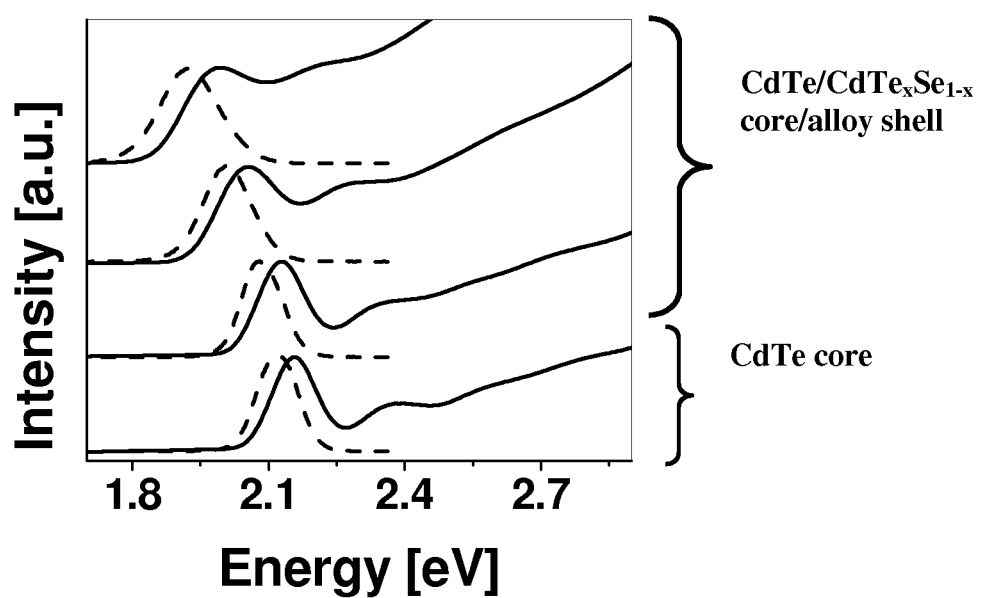
FIG. 7 shows a set of absorption (continuous lines) and emission (dashed lines) spectra of core CdTe CQDs (bottom curve) and the spectra of the corresponding core-alloy shell CQDs (three top curves), with gradual red shift of the optical transitions, indicating increase of the shell thickness. Complementary chemical analysis measurements using energy dispersive analysis of X-ray revealed also a gradual increase of the Se/Te ratio. Transmission electron microscopy revealed corresponding increase of the thickness from 0.6 nm to ~2.4 nm (from 1 to 4 monolayers).
Figure 8:
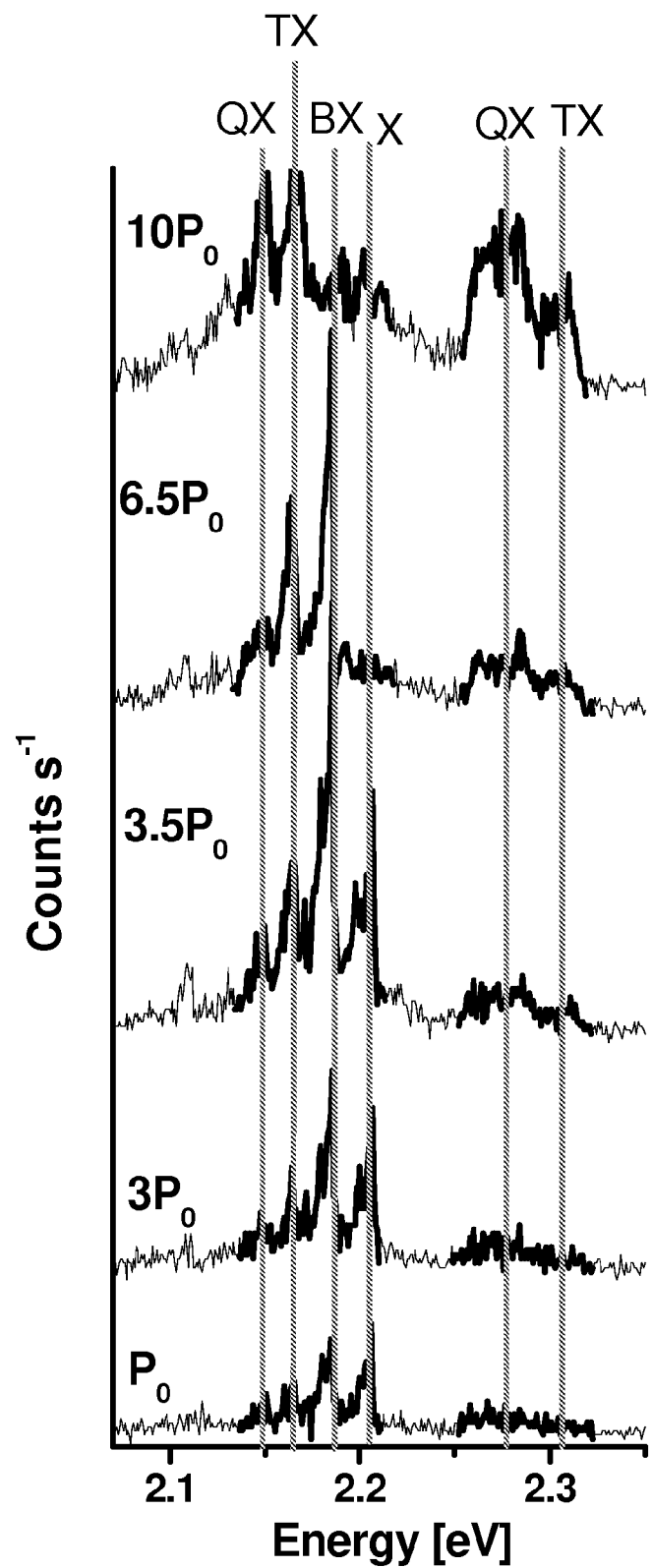
FIG. 8 shows a set of micro-photoluminescence spectra recorded under different excitation power ($P_0$=0.1 µW). The progression of the spectra and the notations (X, BX, TX and QX) are described in Example 10 hereinafter.

The formation of the CdTe/CdTe$_x$Se$_{1-x}$ core/alloy-shell structures is based on the pre-prepared cores, according to the following formulas: (a) injection of Se-precursor solution of low Se concentration (stoichiometric amounts suitable for the formation of an epitaxial shell), into the primary solution of the CdTe cores. The preliminary results (FIGS. 7 and 8) suggest that the excess Cd ions at the core surfaces are sufficient for the formation of CdTe$_x$Se$_{1-x}$ epitaxial alloy-shell. Shell thickness can be regulated from 1 to 8 nm, by controlling the initial Se concentration; (b) precipitation of the pre-prepared cores from the primary solution and their re-dispersion in a Te-free solution, followed by an injection of Cd- and Se-precursors, to form an epitaxial CdTe$_x$Se$_{1-x}$ shell; (c) precipitation of CdTe/CdTe$_x$Se$_{1-x}$ CQDs prepared in formula (a) and their re-dispersion in a Te-free solution, ready for an injection of the appropriate Cd- and Se-concentrations for the formation of an additional epitaxial layer with a pure CdSe composition.

Example 10

Prove of a Blinking Free Behavior of CdTe/CdTe$_x$Se$_{1-x}$ NCs, Using Micro-Photoluminescence Spectroscopy The present example discusses the investigation of CdTe/CdTe$_x$Se$_{1-x}$ individual CQDs, using micro-photoluminescence (μ-PL) spectroscopy. The core-alloy shell structures investigated offered a few advantages with respect to simple CdTe cores: (a) an increase of the effective CQD's volume; (b) improved chemical robustness over a length of weeks and months; (c) a reduction of the dielectric contrast between the core and its immediate surrounding; (d) a possible control of the carriers' spatial distribution between the core and the shell by varying the ratio between the core radius and the shell thickness, forming quasi-type II off-set; (e) the core-alloyed shell CQDs demonstrate a gradual change in the Te/S ratio, when moving from the interior core toward the shell exterior surface, minimizing crystallographic mismatch and thus, eliminating trapping sites and avoiding discontinuity in the dielectric constant at the core-shell interface.

The current example demonstrates well-resolved neutral single-exciton (X), biexciton (BX), triexciton (TX) and quadraexciton (QX) emission bands in the μ-PL spectrum of a single CdTe/CdTe$_x$Se$_{1-x}$ core-alloy shell CQD, pumped by a continuous-wave (cw) excitation and exhibiting nearly blinking-free behavior (no fluorescence intermitancies). The multiexcitons were generated by a sequential filling of the s- and p-electronic shells with the increase of the excitation power. Identification of the multiexciton emission bands was based on the evolution of the μ-PL spectrum with a change in the pumping power (from $P_0=0.1$ µW), showing dominancy of single and biexciton bands at the lowest pumping power, which fade away upon the increase of the pumping intensity, and these bands were replaced by a higher-order excitons at the highest pumping attained. A contour plot of the emission bands' intensity versus energy and observation duration showed a remarkable spectral stability, revealing a blinking-free behavior (not shown). The binding energy of a multiexciton was determined by a standard second order perturbation theory, showing close agreement with the relevant experimental multiexciton emission energy.

The study proved the significant merit of the core-alloy shell CQDs, enabling the investigation of a unique physical phenomenon, e.g., multiexcitons, in a direct way, not accessible in the study of simple cores. The well-resolved multi-exciton emission bands of individual CQDs, under steady state excitation, suggests a significant suppression of the non-radiative Auger process, related to a weakening of Coulomb interaction, by carriers' charge separation, as well as a reduction of the effective dielectric contrast between the core and its immediate surrounding in the CdTe/CdSe core-shell CQDs. This should permit charge extraction in photovoltaic cells and inversion of population in a gain device.

REFERENCES

Atatüre M., Dreiser J., Badolato A., Högele A., Karrai K., Imamoglu A., *Science*, 2006, 312, 551

Bang J. H., Kamat P. V., *ACS Nano*, 2009, 3(6), 1467

Beard M. C., Knutsen K. K., Yu P., Luther J., Song Q., Ellingson R. J., Nozik A. J., *Nano Lett.*, 2007, 7, 2506

Brumer M., Kigel A., Sashchiuk A., Lifshitz E., *Adv. Fun. Mat.*, 2005, 15, 1111

Brus L. E., *J. Chem. Phys.*, 1984, 80, 4403

Chamarro M., Gourdon C., Lavallard P., Lublinskaya O., Ekimov A. I., *Phys. Rev. B*, 1996, 53, 1336

Choudhury K. R., Sahoo Y., Jang S., Prasad P. N., *Adv. Func. Mater.*, 2005, 15(5), 751

Dabbousi B. O., Rodriguez-Viejo J., Mikulec F. W., Heine J. R., Mattoussi H., Ober R., Jensen K. F., Bawendi M. G., *J. Phys. Chem.*, 1997, 101, 9463

Dekel E., Gershoni D., Ehrenfreund E., Garcia J. M., Petroff P. M., *Phys. Rev. B*, 2000, 61(16), 11009

DiVincenzo D. P., *Science*, 1995, 270, 255

Dorfs D., Franzl T., Osovsky R., Brumer M., Lifshitz E., Klar T. A., Eychmüller A., *Small*, 2008, 4(8), 1148

Dubertret B., *Nature Materials*, 2005, 4, 797

Efros Al. L., Efros A. L., *Soviet Phys. Semicond.*, 1982, 16, 772

Efros A. L., Rosen M., Kuno M., Nirmal M., Norris D. J., Bawendi M., *Phys. Rev. B*, 1996, 54, 4843

Efros A. L., Rosen M., *Phys. Rev. Lett.*, 1997, 78, 1110

Empedocles S. A., Neuhauser R., Bawendi M. G., *Nature*, 1999, 399, 126

Fradkin L., Langof L., Lifshitz E., Rogach A., Gaponik N., Weller H., Eychmuller A., *ChemPhysChem*, 2003, 4, 1203

Franceschetti A., Zunger A., *Phys. Rev. B*, 2000, 62(24), R16287

Gunes S., Fritzb K. P., Neugebauer H., Sariciftci N. S., Kumarb S., Scholes G. D., *Sol. Energy Mater. Sol. Cells*, 2007, 91, 420

Harbold J. M., Du H., Krauss T. D., Cho K. S., Murray C. B., Wise F. W., *Phys. Rev. B*, 2005, 72, 195312

Kim S., Fisher B., Eisler H. J., Bawendi M. J., *Am. Chem. Soc.*, 2003, 125, 11466

Klimov V. I., Mikhailovsky A. A., Xu S., Malko A., Hollingsworth J. A., Leatherdale C. A., Eisler H. J., Bawendi M. G., *Science*, 2000, 290, 314

Klimov V. I., Mikhailovsky A. A., McBranch D. W., Leatherdale C. A., Bawendi M. G., *Science*, 2000, 287, 1011

Klimov V. I., Ivanov S. A., Nanda J., Achermann M., Bezel I., McGuire J. A., Piryatinski A., *Nature*, 2007, 447, 441

Kroner M., Weiss K. M., Biedermann B., Seidl S., Manus S., Holleitner A. W., Badolato A., Petroff P. M., Gerardot B. D., Warburton R. J., Karrai K., *Phys. Rev. Lett.*, 2008, 100, 156803

Li l., Daou T. J., Texier I., Thi Kim Chi T., Quang Liem N., Reiss P., *Chem. Mater.*, 2009, 21, 2422

Lifshitz E., Bashouti M., Kloper V., Kigel A., Eisen M. S., Berger S., *Nano Letters*, 2003, 3, 857

Lifshitz E., Brumer M., Kigel A., Sashchiuk A., Bashouti M., Sirota M., Galun E., Burshtein Z., Le Quang A. Q., Ledoux-Rak I., Zyss J., *J. Phys. Chem. B*, 2006, 110, 25356

Loss D., DiVincenzo D. P., *Phys. Rev. A*, 1998, 57, 120

Ma W., Luther J. M., Zheng H., Wu Y., Alivisatos A. P., *Nano Lett.*, 2009, 9(4), 2072

Mcguire J. A., Joo J., Pietryga J. M., Schaller I. D., Klimov V. I., *Accounts of Chemical Research*, 2008, 41(12), 1810

Mews A., Eychmuller A., Giersig M., Schooss D., Weller H., *J. Phys. Chem.*, 1994, 98, 934

Micic O. I., Smith B. B., Nozik A. J., *J. Phys. Chem. B*, 2000, 104, 12149

Millo O., Katz D., Cao Y. W., Banin U., *Phys. Stat. Sol. B*, 2001, 224, 271

Murayama K., Hagiwara Y., Nakata H., *Sol. Stat. Comm.*, 2001, 117, 419

Murphy J. E., Beard M. C., Nozik A. J., *J. Phys. Chem. B*, 2006, 110, 25455

Murray C. B., Shouheng S., Gaschler W., Doyle H., Betley T. A., Kagan C. R., *IBM J. Res. & Dev.*, 2001, 45, 47

Nair G., Bawendi M. G., *Phys. Rev. B*, 2007, 76, 081304

Neuhauser R. G., Shimizu K. T., Woo W. K., Empedocles S. A., Bawendi M. G., *Phys. Rev. Lett.*, 2000, 85, 3301

Nozik A. J., *Physica E*, 2002, 14, 115

Nozik A. J., *Chem. Phys. Lett.*, 2008, 457, 3

Oron D., Kazes M., Banin U., *Phys. Rev. B*, 2007, 75, 035330

Osovsky R., Cheskis D., Kloper V., Sashchiuk A., Kroner M., Lifshitz E., *Phys. Rev. Lett.*, 2009, 102, 197401

Pakovich Y. P., Filonovich S. A., Gomes M. J. M., Donegan J. F., Talapin D. V., Rogach A. L., Eychmuller A., *Phys. Stat. Sol. B*, 2002, 229, 449

Peng X. G., Schlamp M. C., Kadavanich A. V., Alivisatos A. P., *J. Am. Chem. Soc.*, 1997, 119, 7019

Piryatinski A., Ivanov S. A., Tretiak S., Klimov V. I., *Nano Lett.*, 2007, 7(1), 108

Reiss P., Bleuse J., Pron A., *Nano Lett.*, 2002, 2, 7, 781

Santoni A., Paolucci G., Santoro G., Prince K. C., Christensen N. I., *J. Phys. Cond. Matt*, 1992, 4, 6759

Sashchiuk A., Amirav L., Bashouti M., Krueger M., Sivan U., Lifshitz E., *Nano Letters*, 2003, 4, 159

Sashchiuk A., Langof L., Chaim R., Lifshitz E., *J. Cry. Growth*, 2002, 240, 431

Shumway J., Franceschetti A., Zunger A., *Phys. Rev. B*, 2001, 63, 155316

Smith A. M., Mohs A. M., Nie S., *Nature Nanotechnology*, 2009, 4, 56

Somers R. C., Bawendi M. G., Nocera D. G., *Chem. Soc. Rev.*, 2007, 36, 579

Spanhel L., Haase M., Weller H., Henglein A., *J. Am. Chem. Soc.*, 1987, 109, 5649

Steckel J. S., Zimmer J. P., Coe-Sullivan S., Stott N. E., Bulovic V., Bawendi M. G., *Angew. Chem. Int. Ed.,* 2004, 43, 2154

Talapin D. V., Rogach A. L., Kornowski A., Haase M., Weller H., *Nano Lett.,* 2001, 1, 207

Thomas N. L., Allione M., Fedutik Y., Woggon U., Artemyev M. V., Ustinovich E. A., *Appl. Phys. Lett.,* 2006, 89, 263115

Trinh M. T., Houtepen A. J., Schins J. M., Hanrath T., Piris J., Knulst W., Goossens A. P. L. M., Siebbeles L. D. A., *Nano Lett.,* 2008, 8(6), 1713

Weast Ed. R. C., *"Handbook of Chemistry and Physics"*, CRC, 60$^{th}$ edition, 1979-1980, B-220.

Wei S. H., Zunger A., *Phys. Rev. B.,* 1997, 55, 13605

Yu W. W., Falkner J. C., Shih B. S., Colvin V. L., *Chem. Mater.,* 2004, 16, 3318

The invention claimed is:

1. A core-alloyed shell semiconductor nanocrystal comprising:
   (i) a core of a single semiconductor material having a selected band gap energy, said core having the structure AB;
   (ii) a core-overcoating shell consisting of one or more layers comprised of an alloy of the said semiconductor of (i) and a second semiconductor, said shell having the structure $AB_xC_{1-x}$, wherein an interface is formed between core (i) and shell (ii); and
   (iii) an outer organic ligand layer,
   wherein A is Pb; B and C are different and selected from the group consisting of S, Se and Te; x is the mole fraction of B and 1−x is the mole fraction of C, with x gradually changing within a range wherein x<1 and x>0.

2. The core-alloyed shell semiconductor nanocrystal of claim 1, wherein the band gap energy of the core semiconductor material is in the infrared energy range.

3. The core-alloyed shell semiconductor nanocrystal of claim 1, wherein the core semiconductor material is PbSe and the alloy shell semiconductor material has the $PbSe_xS_{1-x}$ structure.

4. The core-alloyed shell semiconductor nanocrystal of claim 1, wherein the alloyed shell exhibits gradual change of the crystallographic lattice spacing.

5. The core-alloyed shell semiconductor nanocrystal of claim 1, wherein the alloyed shell exhibits gradual change of the dielectric constant.

6. The core-alloyed shell semiconductor nanocrystal of claim 1, wherein the nanocrystal size is in the range of about 3 nm to about 100 nm.

7. The core-alloyed shell semiconductor nanocrystal of claim 1, wherein said core alloyed shell semiconductor nanocrystal exhibits less than a 10% root-mean-square (rms) deviation in diameter.

8. The core-alloyed shell semiconductor nanocrystal of claim 1, wherein the nanocrystal exhibits photoluminescence having quantum yields of greater than 20%.

9. The core-alloyed shell semiconductor nanocrystal of claim 1, further comprising an exterior shell overcoating said alloyed shell, said exterior shell consisting of one or more layers comprised of one of said semiconductor materials.

10. The core-alloyed shell semiconductor nanocrystal of claim 9, wherein the core has the structure of AB; the core-overcoating shell comprises an alloy of the $AB_xC_{1-x}$ structure; and the exterior shell has the structure of AB or AC.

11. The core-alloyed shell semiconductor nanocrystal of claim 10, wherein the core semiconductor material is PbSe or PbS, the alloy shell semiconductor material has the $PbSe_xS_{1-x}$ structure, and the exterior shell semiconductor material is PbSe or PbS.

12. A single-pot process for the synthesis of a core-alloyed shell semiconductor nanocrystal of claim 1, comprising:
   (i) simultaneous injection of stoichiometric amounts of the core and shell semiconductor precursors into a solution comprised of the organic ligands or in which solution the organic ligands are dissolved, at elevated temperatures, under inert conditions, whereby a fast nucleation of the core semiconductor material occurs, followed by a deposition of the semiconductor shell material with a gradual composition; or
   (ii) injection of stoichiometric amounts of the core semiconductor precursors into a solution comprised of organic ligands or in which said organic ligands are dissolved, at elevated temperatures, under inert conditions, whereby a fast nucleation of the core semiconductor material occurs, followed by reduction of the temperature so as to terminate the core semiconductor material growth, and injection of a stoichiometric amount of the shell anionic precursor into said solution, at elevated temperatures, under inert conditions, resulting in a deposition of the semiconductor shell material with a gradual composition.

13. A single pot process for the synthesis of a core-alloyed shell semiconductor $PbSe/PbSe_xS_{1-x}$ nanocrystal of claim 3, comprising injecting a mixture of: (i) the precursor lead acetate trihydrate, or lead oxide, dissolved in a solution of phenyl ether, oleic acid and trioctylphosphine (TOP) and (ii) a chalcogen precursor mixture of Se and S dissolved in TOP, into a pre-heated phenyl ether solution; terminating the nanocrystals growth by quenching to room temperature; and isolating the $PbSe/PbSe_xS_{1-x}$ nanocrystals.

14. A nanocrystal array composed of a plurality of core-alloyed shell semiconductor nanocrystals of claim 1, in ordered or disordered packing, with close proximity of said nanocrystals, reserving the properties of individual nanocrystals and creating new collective effects.

* * * * *